(12) United States Patent  
Sakata et al.

(10) Patent No.: US 11,003,227 B2  
(45) Date of Patent: May 11, 2021

(54) LIQUID-TYPE COOLING APPARATUS AND MANUFACTURING METHOD FOR HEAT RADIATION FIN IN LIQUID-TYPE COOLING APPARATUS

(71) Applicant: Mitsubishi Electric Corporation, Tokyo (JP)

(72) Inventors: Kazuki Sakata, Tokyo (JP); Masasi Sakai, Tokyo (JP); Masayosi Tamura, Tokyo (JP); Seiji Haga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 107 days.

(21) Appl. No.: 15/546,721

(22) PCT Filed: Jun. 3, 2015

(86) PCT No.: PCT/JP2015/065988  
§ 371 (c)(1),  
(2) Date: Jul. 27, 2017

(87) PCT Pub. No.: WO2016/194158  
PCT Pub. Date: Dec. 8, 2016

(65) Prior Publication Data  
US 2018/0024599 A1 Jan. 25, 2018

(51) Int. Cl.  
*G06F 1/20* (2006.01)  
*H05K 7/20* (2006.01)  
(Continued)

(52) U.S. Cl.  
CPC .............. *G06F 1/20* (2013.01); *H01L 23/473* (2013.01); *H05K 7/2039* (2013.01);  
(Continued)

(58) Field of Classification Search  
CPC . G06F 1/20; G06F 2200/201; H05K 7/20254; H05K 7/2039; H01L 23/3731;  
(Continued)

(56) References Cited

U.S. PATENT DOCUMENTS 4,953,634 A 9/1990 Nelson et al.  
5,002,123 A * 3/1991 Nelson .................. F28F 3/02  
165/147

(Continued)

FOREIGN PATENT DOCUMENTS

EP 1925898 A1 5/2008  
EP 3032580 A4 * 3/2017 ......... H05K 7/20927

(Continued)

OTHER PUBLICATIONS

Japanese Office Action dated Jul. 24, 2018 in Patent Application No. 2017-521411.

(Continued)

*Primary Examiner* — Binh B Tran  
*Assistant Examiner* — Michael A Matey  
(74) *Attorney, Agent, or Firm* — Sughrue Mion, PLLC; Richard C. Turner

(57) ABSTRACT

There is provided a heat sink in which the thermal resistance from a portion where the heat sink directly or indirectly makes contact with a heat-generating device to a portion where the heat sink makes contact with a coolant is set to be a value that is different from the thermal resistance at a different position in the flowing direction of the coolant, so that it is made possible to suppress the temperature difference between the upstream end and the downstream end of the heat-generating device.

15 Claims, 16 Drawing Sheets

(51) Int. Cl.
  *H01L 23/473* (2006.01)
  *H01L 23/373* (2006.01)
  *H01L 23/15* (2006.01)
  *H01L 25/07* (2006.01)

(52) U.S. Cl.
  CPC ... *H05K 7/20254* (2013.01); *G06F 2200/201* (2013.01); *H01L 23/15* (2013.01); *H01L 23/3731* (2013.01); *H01L 23/3736* (2013.01); *H01L 25/072* (2013.01)

(58) Field of Classification Search
  CPC ... H01L 23/3736; H01L 23/473; H01L 23/15; H01L 25/072
  See application file for complete search history.

(56) References Cited

U.S. PATENT DOCUMENTS

| | | | |
|---|---|---|---|
| 6,039,114 A * | 3/2000 | Becker | H01L 23/473 165/170 |
| 6,173,758 B1 * | 1/2001 | Ward | H01L 23/3677 165/80.3 |
| 6,729,383 B1 * | 5/2004 | Cannell | F28F 3/022 165/185 |
| 6,935,419 B2 * | 8/2005 | Malone | F28F 3/02 165/146 |
| 6,951,243 B2 * | 10/2005 | Nilson | F28D 15/043 165/104.21 |
| 7,102,260 B2 * | 9/2006 | Takenaka | H02K 5/20 310/52 |
| 7,578,337 B2 * | 8/2009 | Spokoiny | H05K 7/20254 165/109.1 |
| 8,981,556 B2 * | 3/2015 | Joshi | H01L 23/4735 257/714 |
| 9,074,823 B2 * | 7/2015 | Chang | F28F 13/06 |
| 9,414,525 B2 * | 8/2016 | Campbell | H05K 7/2039 |
| 9,472,488 B2 * | 10/2016 | Gohara | H01L 23/473 |
| 9,523,541 B2 * | 12/2016 | Kawaura | H05K 7/2039 |
| 10,617,035 B2 * | 4/2020 | Mayberry | B33Y 80/00 |
| 2002/0066550 A1 * | 6/2002 | Tavassoli | F28F 3/02 165/80.2 |
| 2004/0150956 A1 * | 8/2004 | Conte | H01L 23/3677 361/709 |
| 2005/0092007 A1 * | 5/2005 | Gutfeld | F28F 3/04 62/259.2 |
| 2006/0021736 A1 * | 2/2006 | Tran | F28F 3/022 165/80.3 |
| 2008/0017360 A1 * | 1/2008 | Campbell | H01L 23/473 165/148 |
| 2009/0114372 A1 * | 5/2009 | Ippoushi | F28F 3/022 165/104.14 |
| 2009/0145581 A1 * | 6/2009 | Hoffman | F28F 1/40 165/80.3 |
| 2009/0302458 A1 * | 12/2009 | Kubo | H01L 23/3672 257/706 |
| 2010/0172091 A1 * | 7/2010 | Nishiura | H01L 23/3735 361/689 |
| 2010/0276135 A1 * | 11/2010 | Morino | B23P 15/26 165/185 |
| 2011/0079376 A1 | 4/2011 | Loong et al. | |
| 2013/0112388 A1 | 5/2013 | Kwak et al. | |
| 2013/0220587 A1 * | 8/2013 | Tamura | F28F 3/02 165/185 |
| 2014/0043765 A1 * | 2/2014 | Gohara | H01L 23/3735 361/699 |
| 2014/0138075 A1 * | 5/2014 | Yang | H01L 23/3735 165/185 |
| 2014/0158324 A1 * | 6/2014 | Tochiyama | H05K 7/20281 165/67 |
| 2015/0008574 A1 * | 1/2015 | Gohara | H01L 23/473 257/714 |
| 2015/0093823 A1 * | 4/2015 | Sutton | C12M 25/02 435/375 |
| 2016/0025424 A1 * | 1/2016 | Mabuchi | F28D 1/05366 165/151 |
| 2016/0097599 A1 * | 4/2016 | Iwasaki | F28F 3/027 165/175 |
| 2016/0133999 A1 * | 5/2016 | Lee | H01M 10/6567 429/120 |
| 2016/0190038 A1 * | 6/2016 | Koyama | H05K 7/20927 257/693 |
| 2018/0257776 A1 * | 9/2018 | Phan | B64C 39/024 |
| 2019/0077004 A1 * | 3/2019 | Numata | B25F 5/008 |

FOREIGN PATENT DOCUMENTS

| | | |
|---|---|---|
| JP | 2002-141164 A | 5/2002 |
| JP | 2005-327795 A | 11/2005 |
| JP | 4699820 B2 | 6/2011 |
| JP | 2012-033966 A | 2/2012 |
| JP | 2012-069892 A | 4/2012 |
| JP | 2012-182411 A | 9/2012 |
| JP | 2013-098530 A | 5/2013 |
| JP | 2013-165097 A | 8/2013 |
| JP | 2013-175526 A | 9/2013 |
| JP | 2013-197159 A | 9/2013 |
| JP | 2013-254772 A | 12/2013 |
| JP | 6138197 B2 | 5/2017 |
| WO | 2013/118809 A1 | 8/2013 |
| WO | 2013/118869 A1 | 8/2013 |

OTHER PUBLICATIONS

International Search Report for PCT/JP2015/065988, dated Aug. 25, 2015.
Extended European Search Report dated Jan. 3, 2019 issue by the European Patent Office in counterpart application No. 15894191.4.
Communication dated Mar. 27, 2018 from the Japanese Patent Office in counterpart application No. 2017-521411.
Communication dated May 16, 2019, from the European Patent Office in counterpart application No. 15894191.4.
Communication dated Aug. 2, 2019 from the State Intellectual Property Office of the P.R.C. in counterpart Application No. 201580080306.5.
Office Action dated Nov. 13, 2019 in European Application No. 15894191.4.
Communication dated Apr. 1, 2020, from the European Patent Office in application No. 15894191.4.
Communication dated Feb. 24, 2020 from European Patent Office in EP Application No. 19196931.0.
Communication dated Feb. 25, 2020 from the China National Intellectual Property Administration in Application No. 201580080306.5.

* cited by examiner $$\begin{cases} T_{w1U} < T_{w1D} < T_{w2U} < T_{w2D} < T_{w3U} < T_{w3D} \\ R_{1U} > R_{1D} > R_{2U} > R_{2D} > R_{3U} > R_{3D} \\ T_{c1U} = T_{c1D} = T_{c2U} = T_{c2D} = T_{c3U} = T_{c3D} \end{cases}$$

$V_1 < V_2$

LIQUID-TYPE COOLING APPARATUS AND MANUFACTURING METHOD FOR HEAT RADIATION FIN IN LIQUID-TYPE COOLING APPARATUS

This application is a National Stage of International Application No. PCT/JP2015/065988 filed Jun. 3, 2015, the contents of all of which are incorporated herein by reference in their entirety.

TECHNICAL FIELD

The present invention relates to a liquid-type cooling apparatus provided with a heat sink for radiating heat from a heating body to coolant and relates to a manufacturing method for a heat radiation fin in the liquid-type cooling apparatus.

BACKGROUND ART

In recent years, the heat-generation densities of heat-generating devices such as a CPU (central processing unit), an LSI (large-scale integration), and a power semiconductor device have increased, and hence the temperatures thereof are liable to rise; thus, in some times, a liquid-type cooling apparatus whose cooling performance is higher than that of a conventional air-type cooling apparatus is utilized. In a liquid-type cooling apparatus in which a fin region provided with cooling fins is formed in an extended manner along the flowing direction of a coolant, the temperature of the coolant in the downstream region of the coolant is higher than that of the coolant in the upstream region, due to heat transferred from a heat-generating device disposed in the upstream region.

Accordingly, the temperature of a heat-generating device thermally connected with the coolant in the downstream region is higher than that of a heat-generating device thermally connected with the coolant in the upstream region; thus, a temperature difference occurs between the heat-generating devices. The occurrence of a temperature difference between heat-generating devices poses a problem that there occur variations in the lifetimes of the heat-generating devices or variations in the characteristics of the heat-generating devices; therefore, it is desired to contrive a method for preventing the occurrence of a temperature difference between the heat-generating device in the upstream region and the heat-generating device in the downstream region even when there occurs a temperature difference between the coolant in the upstream region and the coolant in the downstream region.

To date, there has been proposed a technology in which heat-generating devices are arranged in such away as to be in parallel with each other with respect to the flowing direction of a coolant so that the temperature difference between the heat-generating devices is cancelled (e.g., refer to Patent Document 1). In a liquid-type cooling apparatus in which a fin region is formed in an extended manner along the flowing direction of a coolant, the closer to the heat-generating surface a region is, the higher the temperature of the cross section perpendicular to the flowing direction of the coolant is, and the farther from the heat-generating surface the region is, the lower the temperature of the cross section perpendicular to the flowing direction of the coolant is. The heat radiation amount is proportional to the temperature difference between the heat-generating device and the coolant; thus, when a non-uniform temperature distribution occurs in the coolant and hence the temperature of the coolant in the region close to the heat-generating surface becomes high, the cooling performance is deteriorated.

In order to suppress the cooling performance from decreasing, it is required that the temperature distribution of a coolant is made uniform in a cross section perpendicular to the flowing direction of the coolant; in order to make the temperature distribution of the coolant uniform in the cross section perpendicular to the flowing direction of the coolant, the method of stirring the coolant sufficiently is effective. Therefore, to date, there have been proposed a liquid-type cooling apparatus (e.g., refer to Patent Document 2) in which fins are arranged on two surfaces that face each other in a coolant path so that the coolant is stirred and a liquid-type cooling apparatus (e.g., refer to Patent Document 3) in which depressions and protrusions for guiding a coolant are provided in the surfaces of comb-like heat radiation fins so that the coolant is stirred.

PRIOR ART REFERENCE

Patent Document

[Patent Document 1] Japanese Patent Publication No. 4699820

[Patent Document 2] Japanese Patent Application Laid-Open No. 2002-141164

[Patent Document 3] Japanese Patent Application Laid-Open No. 2012-033966

DISCLOSURE OF THE INVENTION

Problems to be Solved by the Invention

In the foregoing liquid-type cooling apparatus disclosed in Patent Document 2, the temperature of the coolant in the downstream region is higher than that of the coolant in the upstream region, due to heat transferred from a heat-generating device in the upstream region. Accordingly, the temperature of a heat-generating device thermally connected with the coolant in the downstream region is higher than that of a heat-generating device thermally connected with the coolant in the upstream region; thus, a temperature difference occurs between the heat-generating devices. The occurrence of a temperature difference between heat-generating devices poses a problem that there occur variations in the lifetimes of the heat-generating devices or variations in the characteristics of the heat-generating devices.

The liquid-type cooling apparatus disclosed in Patent Document 2 is configured in such a way that fins are arranged on two surfaces, in the cooling apparatus, that face each other, and the fins that contribute to heat radiation are only the ones arranged on the surface that is thermally connected with the heat-generating device. Although the fins arranged on the other surface each have a function of stirring the coolant, they do not contribute to heat radiation. As described above, in the case of the conventional liquid-type cooling apparatus disclosed in Patent Document 2, it is required that the fins that do not contribute heat radiation are provided in the cooling apparatus; thus, there has been a problem that the cooling apparatus is upsized.

Moreover, in the case of the foregoing conventional liquid-type cooling apparatus disclosed in Patent Document 1, although the temperature difference between the heat-generating devices is canceled, the flow path is divided into 6 parallel paths; thus, the amount of coolant that flows around the heat-generating device is one-sixth in comparison with a serial flow path. Accordingly, the temperature difference between the upstream side and the downstream side of the heat-generating device is 6 times in comparison with the serial flow path; thus, the temperature difference in the heat-generating device poses new problems such as deterioration in the current distribution in the heat-generating device, breakage of the heat-generating device due to local overheating caused by current concentration, and deterioration in the short-circuit tolerance. Furthermore, in order to distribute uniform amounts of coolant to the respective heat-generating devices arranged in parallel to the ventilation path of the coolant, it is required to provide a flow path assembly unit (header); thus, there has been a problem that downsizing is difficult.

The foregoing conventional liquid-type cooling apparatus disclosed in Patent Document 3 is has a structure in which depressions and protrusions for guiding a coolant are provided in the surfaces of comb-like heat radiation fins so that the coolant is stirred and in which the heat radiation fins are arranged only the surface that is thermally connected with the heat-generating device; thus, although downsizing is possible to some extent, the effect of the depressions and protrusions cannot be provided to the coolant that flows into the region that is away from the depressions and protrusions in the surfaces of the heat radiation fins, i.e., the vicinity of the middle portion between the heat radiation fins; therefore, there has been a problem that the stirring effect cannot sufficiently be obtained.

As described above, in the conventional technology related to the cooling apparatuses, it has been an issue to realize a small-size heat radiation fin that sufficiently exerts the effect of suppressing the temperature difference between the respective heat-generating devices arranged in the upstream and downstream regions of the coolant, the effect of suppressing the temperature difference between the upstream and downstream ends of each of the heat-generating devices, and the effect of stirring the coolant in order to make the temperature distribution of the coolant uniform in a cross section perpendicular to the flowing direction of the coolant.

The present invention has been implemented in order to solve the foregoing problems in the conventional technology; the objective thereof is to provide a liquid-type cooling apparatus that can suppress the temperature difference between the upstream and downstream ends of each of heat-generating devices.

Moreover, the objective of the present invention is to provide a liquid-type cooling apparatus provided with a heat radiation fin that can effectively stir a coolant.

Furthermore, the objective of the present invention is to provide a manufacturing method, for a heat radiation fin, that makes it possible to readily manufacture a heat radiation fin in a liquid-type cooling apparatus.

Means for Solving the Problems

A liquid-type cooling apparatus according to the present invention is a liquid-type cooling apparatus in which there are provided a jacket including a coolant path through which a coolant flows and a heat sink that directly or indirectly makes contact with at least one heat-generating device and makes contact with the coolant flowing in the jacket and in which heat generated by the heat-generating device is transferred to the coolant through the intermediary of the heat sink so that the heat is radiated; the liquid-type cooling apparatus is characterized in that in the heat sink, the thermal resistance from a portion where the heat sink directly or indirectly makes contact with the heat-generating device to a portion where the heat sink makes contact with the coolant is set to be a value that is different from the thermal resistance at a different position in the flowing direction of the coolant.

Moreover, a liquid-type cooling apparatus according to the present invention is a liquid-type cooling apparatus in which there are provided a jacket including a coolant path through which a coolant flows and a heat sink that makes contact with the coolant flowing in the jacket and in which heat generated by a heat-generating device is transferred to the coolant through the intermediary of the heat sink so that the heat is radiated; the liquid-type cooling apparatus is characterized in that the heat sink includes a heat sink base member having a first surface portion that faces the inside of the jacket and a plurality of heat radiation fins that are provided on the first surface portion of the heat sink base member and make contact with the coolant flowing in the jacket and in that the plurality of heat radiation fins are inclined toward the downstream side of the coolant flowing in the jacket.

Furthermore, a manufacturing method for heat radiation fins of the liquid-type cooling apparatus according to the present invention is characterized in that on the first surface portion of the heat sink base member, a plate-shaped heat radiation fin region protruding by a predetermined dimension from the first surface portion is formed and in that a plurality of circular blades that are arranged in such a way as to be spaced a predetermined distance away from one another and whose diameters are different from one another are rotated and then the plurality of circular blades concurrently cut the heat radiation fin region at an inclination angle with respect to the first surface portion so that the plurality of heat radiation fins are formed.

Moreover, a manufacturing method for heat radiation fins of the liquid-type cooling apparatus according to the present invention is characterized in that on the first surface portion of the heat sink base member, there are formed a plurality of protruding threads that are arranged in parallel with one another and that each protrude by a predetermined dimension from the first surface portion, in that each of the plurality of protruding threads includes an inclined protruding thread portion that is provided in such a way as to make contact with the first surface portion and is inclined toward a predetermined direction with respect to the first surface portion and an erect protruding thread portion that is provided in such a way as to make contact with the inclined protruding thread portion and stands erect with respect to the first surface portion, and in that the plurality of heat radiation fins are formed through cutting processing of the plurality of protruding threads.

Advantage of the Invention

In a liquid-type cooling apparatus according to the present invention, the thermal resistance, of the heat sink, from a portion where the heat sink directly or indirectly makes contact with the heat-generating device to a portion where the heat sink makes contact with the coolant is set to be a value that is different from the thermal resistance at a different position in the flowing direction of the coolant; thus, it is made possible to suppress the temperature difference between the upstream and downstream ends of each of the heat-generating devices.

Moreover, in a liquid-type cooling apparatus according to the present invention, because a plurality of heat radiation fins are inclined toward the downstream side of the coolant flowing in the jacket, the coolant is stirred along the side face of the heat radiation fin in the direction parallel to the first surface portion of the heat sink base member and in the direction perpendicular thereto; thus, it is made possible to make the temperature distribution of a coolant uniform in a cross section perpendicular to the flowing direction of the coolant and hence the deterioration in the cooling performance can be suppressed. Accordingly, because the heat radiation fins need to be arranged only on the side where heat generating devices are disposed, there is demonstrated an effect that the liquid-type cooling apparatus can be downsized. Moreover, because it is not required to provide a header, which is a coolant flow path assembly portion, there is demonstrated an effect that the liquid-type cooling apparatus can be downsized.

Moreover, in a manufacturing method for heat radiation fins of the liquid-type cooling apparatus according to the present invention, on the first surface portion of the heat sink base member, a plate-shaped heat radiation fin region protruding by a predetermined dimension from the first surface portion is formed, and a plurality of circular blades that are arranged in such a way as to be spaced a predetermined distance away from one another and whose diameters are different from one another are rotated and then the plurality of circular blades concurrently cut the heat radiation fin region at an inclination angle with respect to the first surface portion so that the plurality of heat radiation fins are formed; thus, inclined heat radiation fins can considerably readily be formed.

Still moreover, in a manufacturing method for heat radiation fins of the liquid-type cooling apparatus according to the present invention, on the first surface portion of the heat sink base member, there are formed a plurality of protruding threads that are arranged in parallel with one another and that each protrude by a predetermined dimension from the first surface portion; each of the plurality of protruding threads includes an inclined protruding thread portion that is provided in such a way as to make contact with the first surface portion and is inclined toward a predetermined direction with respect to the first surface portion and an erect protruding thread portion that is provided in such a way as to make contact with the inclined protruding thread portion and stands erect with respect to the first surface portion; the plurality of heat radiation fins are formed through cutting processing of the plurality of protruding threads. As a result, the heat radiation fin having an inclination portion and an erect portion that makes contact with the inclination portion can considerably readily be formed.

BEST MODE FOR CARRYING OUT THE INVENTION

Embodiment 1

Figure 1:
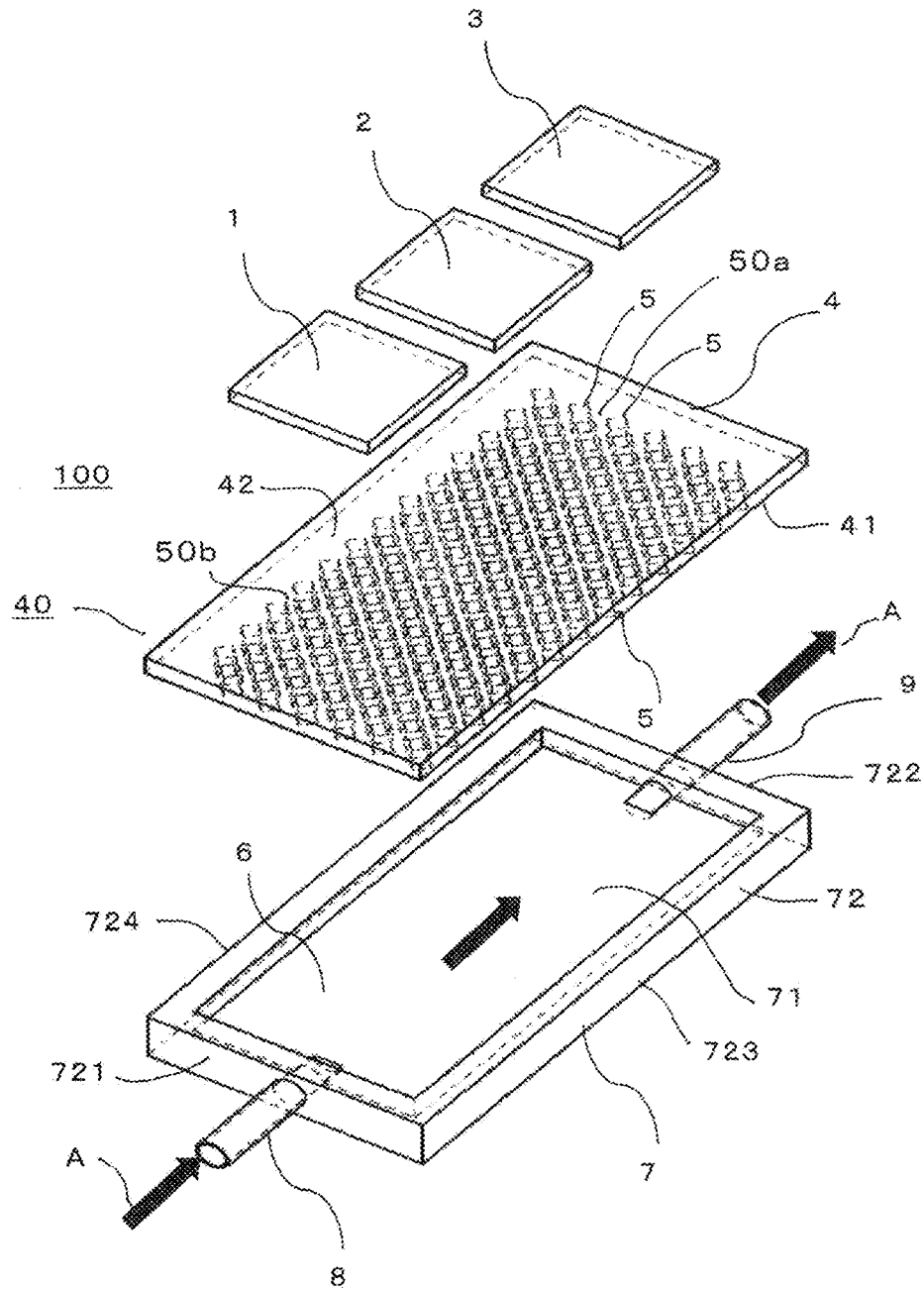
FIG. 1 is an exploded perspective view of a liquid-type cooling apparatus according to Embodiment 1 of the present invention.
Figure 2:
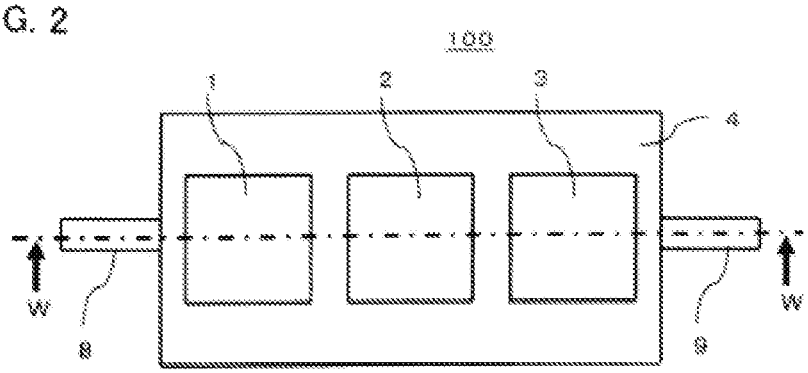
FIG. 2 is a plan view of the liquid-type cooling apparatus according to Embodiment 1 of the present invention.
Figure 3:
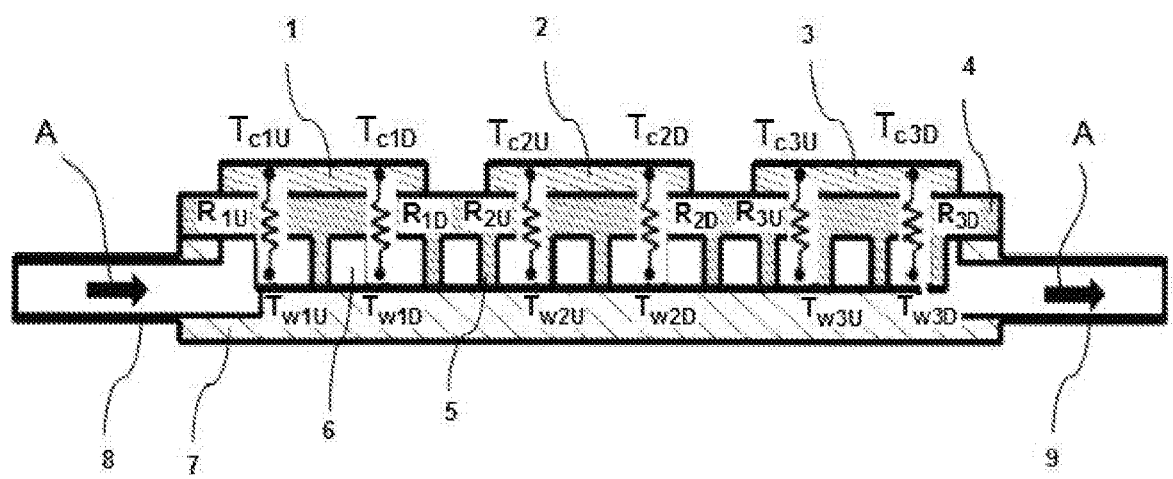
FIG. 3 is an explanatory view schematically illustrating the cross section taken along the W-W line in FIG. 2.

Hereinafter, a liquid-type cooling apparatus according to Embodiment 1 of the present invention will be explained in detail with reference to the drawings. FIG. 1 is an exploded perspective view of a liquid-type cooling apparatus according to Embodiment 1 of the present invention; FIG. 2 is a plan view of a liquid-type cooling apparatus according to Embodiment 1 of the present invention; FIG. 3 is an explanatory view schematically illustrating the cross section taken along the W-W line in FIG. 2. The arrow A in each of FIGS. 1 and 3 indicates the flowing direction of a coolant such as water. In FIGS. 1 and 2, a liquid-type cooling apparatus 100 has a water jacket 7, as a jacket through which a coolant flows, a heat sink 40, a coolant inlet pipe 8, and a coolant outlet pipe 9.

The water jacket 7 has a bottom portion 71, a circumferential wall portion 72 formed integrally with the bottom portion 71, and a coolant path 6 enclosed by the bottom portion 71 and the circumferential wall portion 72. The side, of the coolant path 6, that faces the bottom portion 71 is opened. The circumferential wall portion 72 has a pair of short-side portions 721 and 722 that face each other and a pair of long-side portions 723 and 724 that face each other. The coolant inlet pipe 8 fixed in the circumferential wall portion 72 penetrates one short-side portion 721 of the circumferential wall portion 72 and then is opened in the coolant path 6. The coolant outlet pipe 9 fixed in the circumferential wall portion 72 penetrates the other short-side portion 722 of the circumferential wall portion 72 and then is opened in the coolant path 6.

The heat sink 40 has a heat sink base member 4 and a great number of heat radiation fins 5, described later, formed on a first surface portion 41 of the heat sink base member 4. The heat sink 40 is fixed to the circumferential wall portion 72 of the water jacket 7 in a liquid-tight manner and in such a way that the first surface portion 41 faces the coolant path 6, so that the coolant path 6 is sealed. In other words, the coolant path 6 is formed of a space constituted by the heat sink base member 4 and the bottom portion 71 and the circumferential wall portion 72 of the water jacket 7. The heat radiation fins 5 formed on the first surface portion 41 of the heat sink 40 are inserted into the coolant path 6 of the water jacket 7. A first heat-generating device 1, a second heat-generating device 2, and a third heat-generating device 3, which are power semiconductor devices or the like, are each fixed to a second surface portion 42 of the heat sink 40.

The coolant made of a liquid such as water flows into the coolant path 6 of the water jacket 7 through the coolant inlet pipe 8 and is exhausted to the outside of the coolant path 6 through the coolant outlet pipe 9. The coolant that has flown into the coolant path 6 cools the first heat-generating device 1, the second heat-generating device 2, and the third heat-generating device 3, through the intermediaries of the heat radiation fins 5 and the heat sink base member 4. In this embodiment, the first heat-generating device 1 is disposed at the most upstream side, with respect to the other heat-generating devices, in the flowing direction A of the coolant in the coolant path 6; the third heat-generating device 3 is disposed at the most downstream side, with respect to the other heat-generating devices, in the flowing direction A of the coolant in the coolant path 6; the second heat-generating device 2 is disposed between the first heat-generating device 1 and the third heat-generating device 3.

Next, in FIG. 3, $R_{1U}$, $R_{1D}$, $R_{2U}$, $R_{2D}$, $R_{3U}$, and $R_{3D}$ denote the thermal resistance between the upstream-side portion of the heat-generating device 1 and the coolant, the thermal resistance between the downstream-side portion of the heat-generating device 1 and the coolant, the thermal resistance between the upstream-side portion of the heat-generating device 2 and the coolant, the thermal resistance between the downstream-side portion of the heat-generating device 2 and the coolant, the thermal resistance between the upstream-side portion of the heat-generating device 3 and the coolant, and the thermal resistance between the downstream-side portion of the heat-generating device 3 and the coolant, respectively. In this situation, as described below, in consideration of the temperature rise of the coolant, the relative relationships among the respective thermal resistance values are set in such a way as to continuously decrease in the flowing direction of the coolant.

$$R_{1U} > R_{1D} > R_{2U} > R_{2D} > R_{3U} > R_{3D}$$

$TW_{1U}$, $TW_{1D}$, $TW_{2U}$, $TW_{2D}$, $TW_{3U}$, and $TW_{3D}$ denote the temperature of the coolant directly under the upstream-side portion of the heat-generating device 1, the temperature of the coolant directly under the downstream-side portion of the heat-generating device 1, the temperature of the coolant directly under the upstream-side portion of the heat-generating device 2, the temperature of the coolant directly under the downstream-side portion of the heat-generating device 2, the temperature of the coolant directly under the upstream-side portion of the heat-generating device 3, and the temperature of the coolant directly under the downstream-side portion of the heat-generating device 3, respectively. The temperature of the coolant in the downstream region becomes higher than that of the coolant in the upstream region, due to heat transfer from the heat-generating device disposed in the upstream region. Accordingly, the relative relationships among the respective foregoing temperatures of the coolant are expressed as follows.

$$TW_{1U} < TW_{1D} < TW_{2U} < TW_{2D} < TW_{3U} < TW_{3D}$$

In addition, $TC_{1U}$, $TC_{1D}$, $TC_{2U}$, $TC_{2D}$, $TC_{3U}$, and $TC_{3D}$ denote the temperature of the upstream-side portion of the heat-generating device 1, the temperature of the downstream-side portion of the heat-generating device 1, the temperature of the upstream-side portion of the heat-generating device 2, the temperature of the downstream-side portion of the heat-generating device 2, the temperature of the upstream-side portion of the heat-generating device 3, and the temperature of the downstream-side portion of the heat-generating device 3, respectively.

In this situation, when it is assumed that the respective heat generation amounts of the heat-generating devices 1, 2, and 3 are one and the same, the relative relationships among the respective temperatures of the heat-generating devices 1, 2, and 3 are originally expressed as follows, due to the effect of the temperature difference in the coolant, i.e., temperature differences among the heat-generating devices should be caused.

$$TC_{1U} < TC_{1D} < TC_{2U} < TC_{2D} < TC_{3U} < TC_{3D}$$

However, in the liquid-type cooling apparatus according to Embodiment 1 of the present invention, the thermal resistance is set in such a way as to continuously decrease in the flowing direction of the coolant in accordance with the temperature rise of the coolant, as described above; thus, the differences among the respective temperatures of the heat-generating devices 1, 2, and 3 are suppressed. Moreover, by appropriately adjusting the thermal resistances, it is made possible to make the temperatures of all the heat-generating devices equal. In other words, the following equations can be established.

$$TC_{1U} = TC_{2U} = TC_{3U}$$

$$TC_{1D} = TC_{2D} = TC_{3D}$$

As a result, variations in the lifetimes of the heat-generating devices and variations in the characteristics of the heat-generating devices, caused by variations in the temperatures of the heat-generating devices, can be suppressed.

Moreover, the temperature distribution in each of the heat-generating devices can be made uniform. In other words, the following equations can be established.

$TC_{1U} = TC_{1D}$ $TC_{2U} = TC_{2D}$ $TC_{3U} = TC_{3D}$

As a result, the deterioration in the current distribution in the heat-generating device, caused by the temperature difference in the heat-generating device, the breakage of the heat-generating device, due to local overheating caused by current concentration, and the deterioration in the short-circuit tolerance can be suppressed.

As described above, the thermal resistance is set in such a way as to decrease continuously in the flowing direction of the coolant; the setting of the thermal resistance can specifically be performed through any one of the following means or by combining these means.

(1) The heat radiation capability of the heat radiation fin is made sequentially larger toward the downstream side in the flowing direction of the coolant.

(2) The thickness of the heat sink base member 4 is made gradually smaller toward the downstream side in the flowing direction of the coolant.

(3) The heat sink base member 4 is formed by bonding different materials so that the heat conductivity of the heat sink base member 4 is made gradually larger toward the downstream side in the flowing direction of the coolant.

(4) Heat transfer filler is mixed with the material of the heat sink base member 4 so that the heat conductivity of the heat sink base member 4 is made gradually larger toward the downstream side in the flowing direction of the coolant.

In the foregoing explanation, as an example, the case where the number of the heat-generating devices is three has been described, for the sake of simplicity; however, it goes without saying that the number of the heat-generating devices may be arbitrary. Moreover, in the foregoing explanation, it has been assumed that all the respective heat generation amounts of the heat-generating devices are one and the same; however, it goes without saying that the heat generation amount may differ depending on the heat-generating device and hence it may be allowed that the thermal resistance is increased or decreased in accordance with the heat generation amount of each of the heat-generating devices.

It may be allowed that the heat radiation fin 5 has a shape in which two or more plates having a predetermined thickness are arranged side by side or in which two or more pillars such as columns, elliptic columns, cones, elliptic cones, prisms, and pyramids are arranged side by side. Moreover, it is not necessarily required that the thermal resistance is gradually decreased toward the downstream side in the flowing direction of the coolant; it may be allowed that in the coolant path 6, the thermal resistance is appropriately increased or decreased in accordance with the cooling priority of the heat-generating device.

Embodiment 2

Next, a liquid-type cooling apparatus according to Embodiment 2 of the present invention will be explained. The liquid-type cooling apparatus according to Embodiment 2 of the present invention is characterized in that in a space from a heat-generating device disposed at the most upstream side in the flowing direction of a coolant to a heat-generating device disposed at the most downstream side, the cross-sectional area of the coolant path is changed in accordance with the temperature rise of the coolant.

Figure 4:
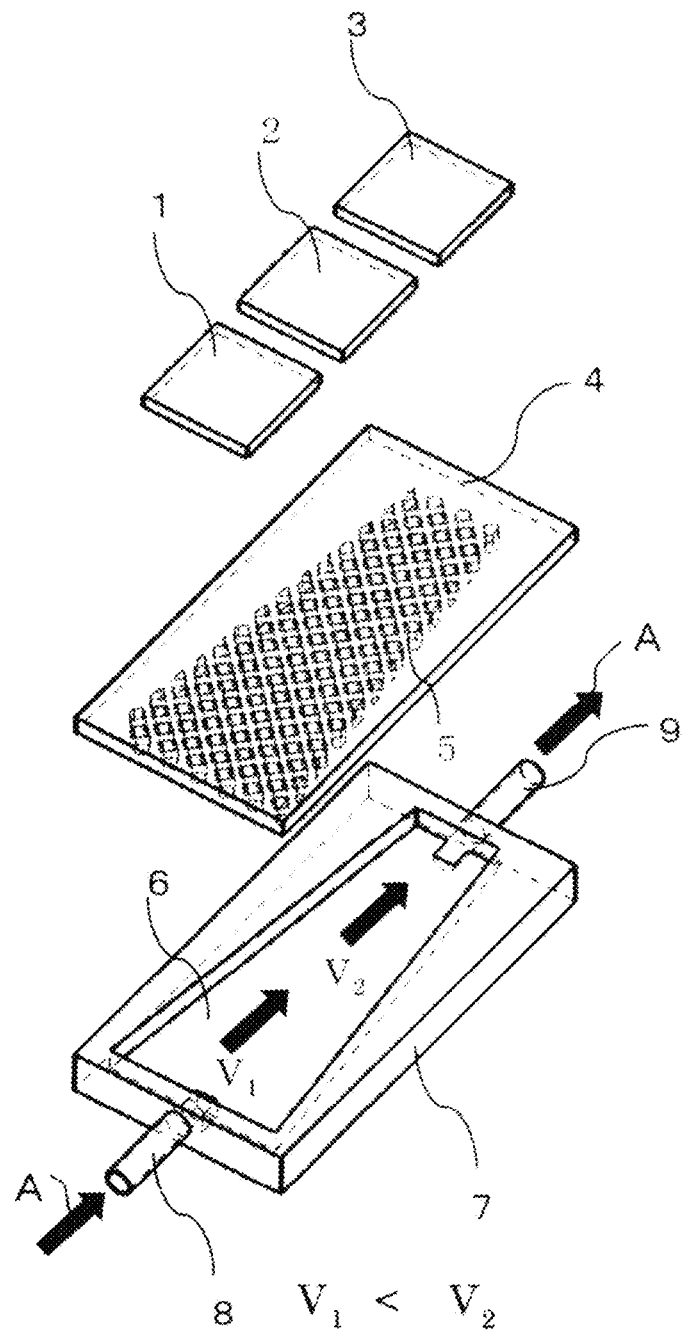
FIG. 4 is an exploded perspective view of a liquid-type cooling apparatus according to Embodiment 2 of the present invention.
Figure 5:
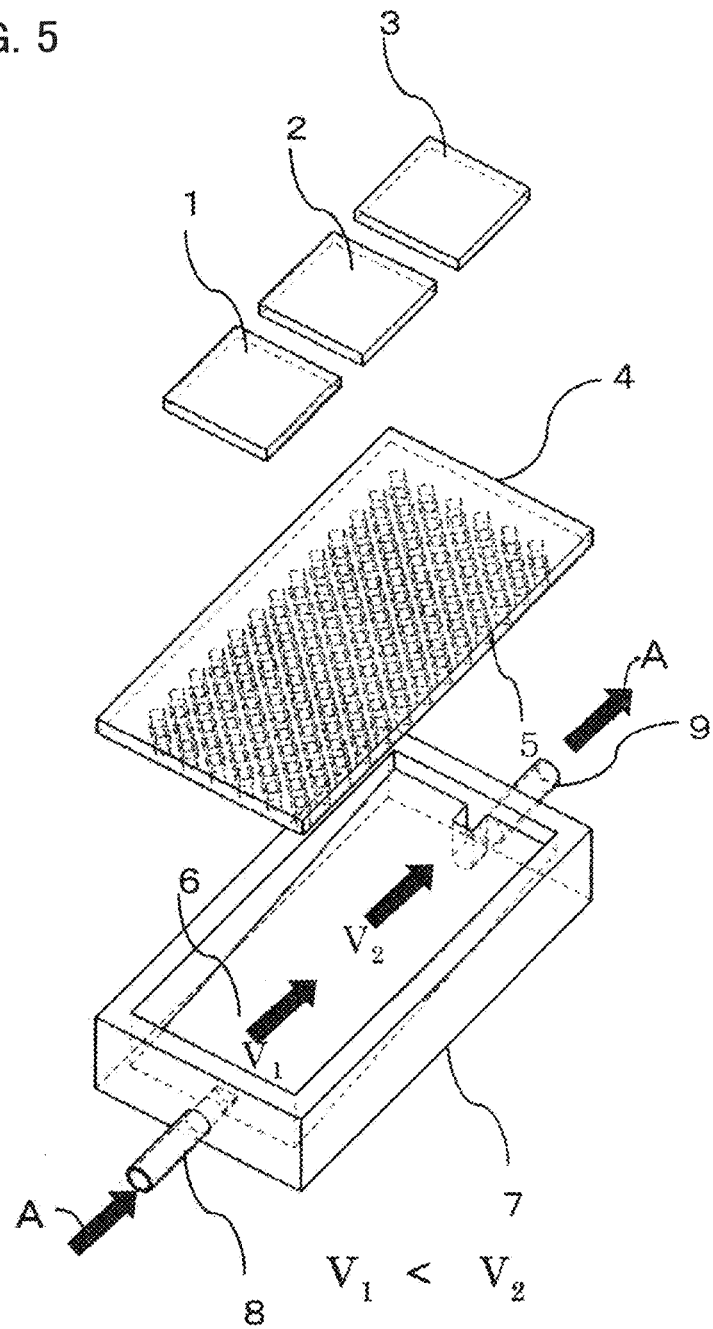
FIG. 5 is an exploded perspective view of a variant example of the liquid-type cooling apparatus according to Embodiment 2 of the present invention.

FIG. 4 is an exploded perspective view of the liquid-type cooling apparatus according to Embodiment 2 of the present invention; FIG. 5 is an exploded perspective view of a variant example of the liquid-type cooling apparatus according to Embodiment 2 of the present invention. The arrow A in each of FIGS. 4 and 5 indicates the flowing direction of a coolant. In each of FIGS. 4 and 5, $V_1$ and $V_2$ denote the flow rate of the coolant in a region where the cross-sectional area of the coolant path 6 is large and the flow rate of the coolant in a region where the cross-sectional area of the coolant path 6 is small, respectively.

The liquid-type cooling apparatus according to Embodiment 2 of the present invention is configured in such a way that the cross-sectional area of the coolant path 6 is decreased in accordance with the continuous temperature rise of the coolant in the space from the most upstream side of the coolant in the coolant path 6 to the most downstream side. Accordingly, the flow rate of the coolant increases in accordance with the decrease in the cross-sectional area of the coolant path 6 ($V_1 < V_2$). When the flow rate of the coolant increases, the heat radiation capability of the heat radiation fin 5 increases; thus, the thermal resistance decreases.

In the liquid-type cooling apparatus, illustrated in FIG. 4, according to Embodiment 2 of the present invention, the cross-sectional area of the coolant path 6 is gradually decreased in the transverse direction of the water jacket 7 and toward the downstream side in the flowing direction of the coolant. In this case, the number of the heat radiation fins 5 is adjusted in accordance with the cross-sectional area of the coolant path 6. That is to say, the number of the heat radiation fins 5 gradually decreases toward the downstream side in the flowing direction A of the coolant.

In a variant example, illustrated in FIG. 5, of the liquid-type cooling apparatus according to Embodiment 2 of the present invention, the cross-sectional area of the coolant path 6 is gradually decreased in the thickness direction of the water jacket 7, i.e., in a direction (height direction) perpendicular to in the flowing direction of the coolant, and toward the downstream side in the flowing direction of the coolant. In this case, the height of the heat radiation fin 5 is adjusted in accordance with the cross-sectional area of the coolant path 6. That is to say, the height of the heat radiation fins 5 gradually decreases toward the downstream side in the flowing direction A of the coolant.

Moreover, it is not necessarily required that the cross-sectional area of the coolant path 6 is gradually decreased toward the downstream side in the flowing direction of the coolant; it may be allowed that the cross-sectional area of the coolant path 6 is appropriately increased or decreased in accordance with the cooling priority of the heat-generating device.

Embodiment 3

Next, a liquid-type cooling apparatus according to Embodiment 3 of the present invention will be explained. The liquid-type cooling apparatus according to Embodiment 3 of the present invention is characterized in that in a space from a heat-generating device disposed at the most upstream side in the flowing direction of a coolant to a heat-generating device disposed at the most downstream side, the height of the heat radiation fin is changed in accordance with the temperature rise of the coolant.

Figure 6:
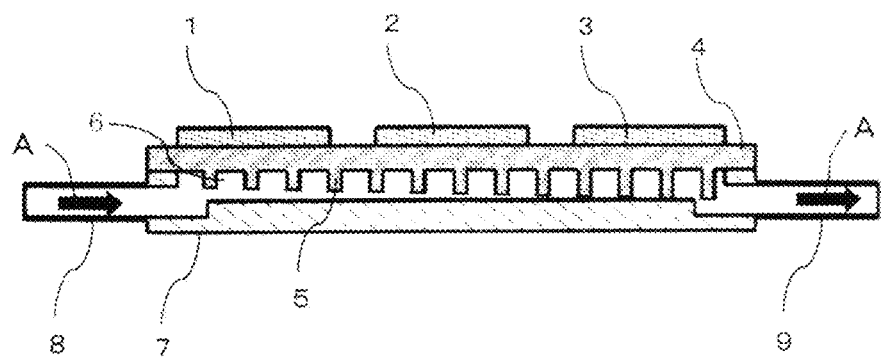
FIG. 6 is a cross-sectional view, taken along the flowing direction of a coolant, of the liquid-type cooling apparatus according to Embodiment 3 of the present invention.

FIG. 6 is a cross-sectional view, taken along the flowing direction of a coolant, of the liquid-type cooling apparatus according to Embodiment 3 of the present invention. The arrow A in FIG. 6 indicates the flowing direction of a coolant. As illustrated in FIG. 6, in a space from a heat-generating device 1 disposed at the most upstream side in the flowing direction of a coolant to a heat-generating device 3 disposed at the most downstream side, the height of the heat radiation fins 5 gradually increases toward the downstream side in the flowing direction A of the coolant. As a result, the surface area of the heat radiation fin increases in proportion to the increase in the height of the heat radiation fins 5. When the surface area of the heat radiation fins 5 increases, the heat radiation capability of the heat radiation fin 5 increases; thus, the thermal resistance decreases.

It is not necessarily required that the height of the heat radiation fins 5 is gradually increased toward the downstream side in the flowing direction of the coolant; it may be allowed that the height of the heat radiation fins 5 is appropriately increased or decreased in accordance with the cooling priority of the heat-generating device.

Embodiment 4

Next, a liquid-type cooling apparatus according to Embodiment 4 of the present invention will be explained. The liquid-type cooling apparatus according to Embodiment 4 of the present invention is characterized in that in a space from a heat-generating device disposed at the most upstream side in the flowing direction of a coolant to a heat-generating device disposed at the most downstream side, the number of heat radiation fins per unit area in the region where the heat radiation fins are arranged is changed in accordance with the temperature rise of the coolant.

Figure 7:
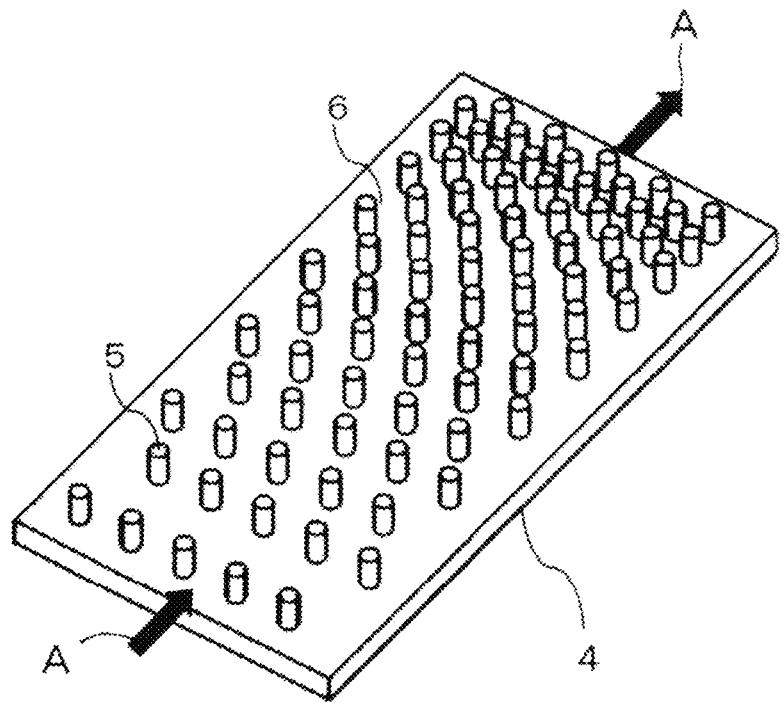
FIG. 7 is a perspective view illustrating a heat sink in a liquid-type cooling apparatus according to Embodiment 4 of the present invention.

FIG. 7 is a perspective view illustrating a heat sink in the liquid-type cooling apparatus according to Embodiment 4 of the present invention; the heat sink is illustrated in such a way that the heat radiation fins face the top side of the drawing. The arrow A in FIG. 7 indicates the flowing direction of a coolant. As illustrated in FIG. 7, in a space from a heat-generating device disposed at the most upstream side in the flowing direction of a coolant to a heat-generating device disposed at the most downstream side, the number of heat radiation fins 5 per unit area in the region where the heat radiation fins are arranged is gradually increased in accordance with the temperature rise of the coolant, i.e., toward the downstream side in the flowing direction of the coolant.

When the number of the heat radiation fins 5 increases, the total surface area of the heat radiation fins 5 increases and the cross-sectional area of the coolant path 6 decreases; thus, the flow rate of the coolant increases. Because the total surface area of the heat radiation fins 5 increases and the flow rate of the coolant increases, the heat radiation capability of the heat radiation fins 5 increases; thus, the thermal resistance decreases.

It is not necessarily required that the number of the heat radiation fins 5 per unit area in the region where the heat radiation fins 5 are arranged is increased toward the downstream side in the flowing direction of the coolant; it may be allowed that the number of the heat radiation fins 5 is appropriately increased or decreased in accordance with the cooling priority of the heat-generating device.

Embodiment 5

Next, a liquid-type cooling apparatus according to Embodiment 5 of the present invention will be explained. The liquid-type cooling apparatus according to Embodiment 5 of the present invention is characterized in that in a space from a heat-generating device disposed at the most upstream side in the flowing direction of a coolant to a heat-generating device disposed at the most downstream side, the volume of each of the heat radiation fins is changed in accordance with the temperature rise of the coolant.

Figure 8:
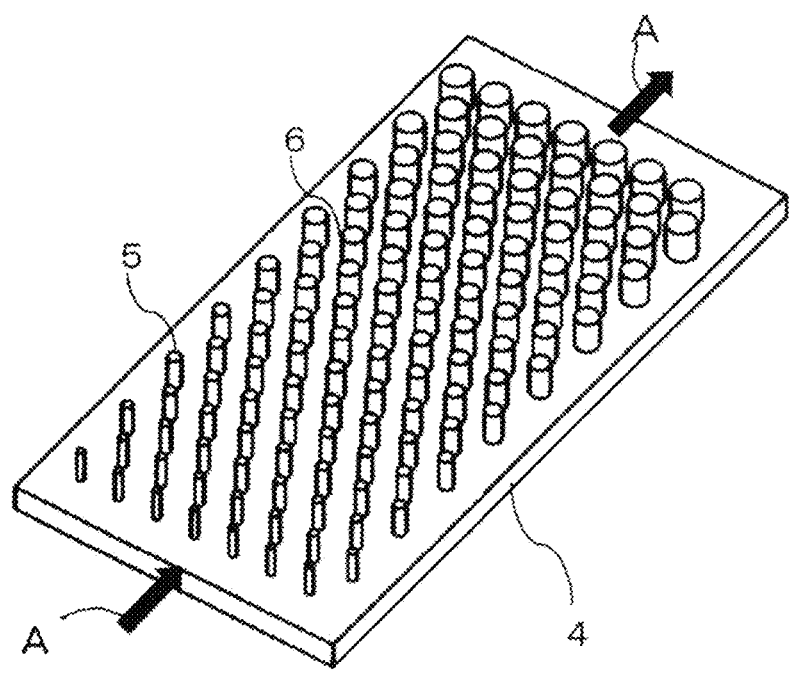
FIG. 8 is a perspective view illustrating a heat sink in a liquid-type cooling apparatus according to Embodiment 5 of the present invention.

FIG. 8 is a perspective view illustrating a heat sink in the liquid-type cooling apparatus according to Embodiment 5 of the present invention; the heat sink is illustrated in such a way that the heat radiation fins face the top side of the drawing. The arrow A in FIG. 8 indicates the flowing direction of a coolant. As illustrated in FIG. 8, in a space from a heat-generating device disposed at the most upstream side in the flowing direction of a coolant to a heat-generating device disposed at the most downstream side, the thickness of the heat radiation fin 5 is gradually increased in accordance with the temperature rise of the coolant so that the volume of each of the heat radiation fins 5 is increased.

When the volume of the heat radiation fin 5 increases, the surface area of the heat radiation fin 5 increases and the cross-sectional area of the coolant path 6 decreases; thus, the flow rate of the coolant increases. Because the total surface area of the heat radiation fins 5 increases and the flow rate of the coolant increases, the heat radiation capability of the heat radiation fins 5 increases; thus, the thermal resistance decreases.

It is not necessarily required that the volume of each of the heat radiation fins 5 is increased toward the downstream side in the flowing direction of the coolant; it may be allowed that the volume of the heat radiation fin 5 is appropriately increased or decreased in accordance with the cooling priority of the heat-generating device.

Embodiment 6

Next, a liquid-type cooling apparatus according to Embodiment 6 of the present invention will be explained. The liquid-type cooling apparatus according to Embodiment 6 of the present invention is characterized in that the heat radiation fin is inclined toward the downstream side in the flowing direction of a coolant.

Figure 9:
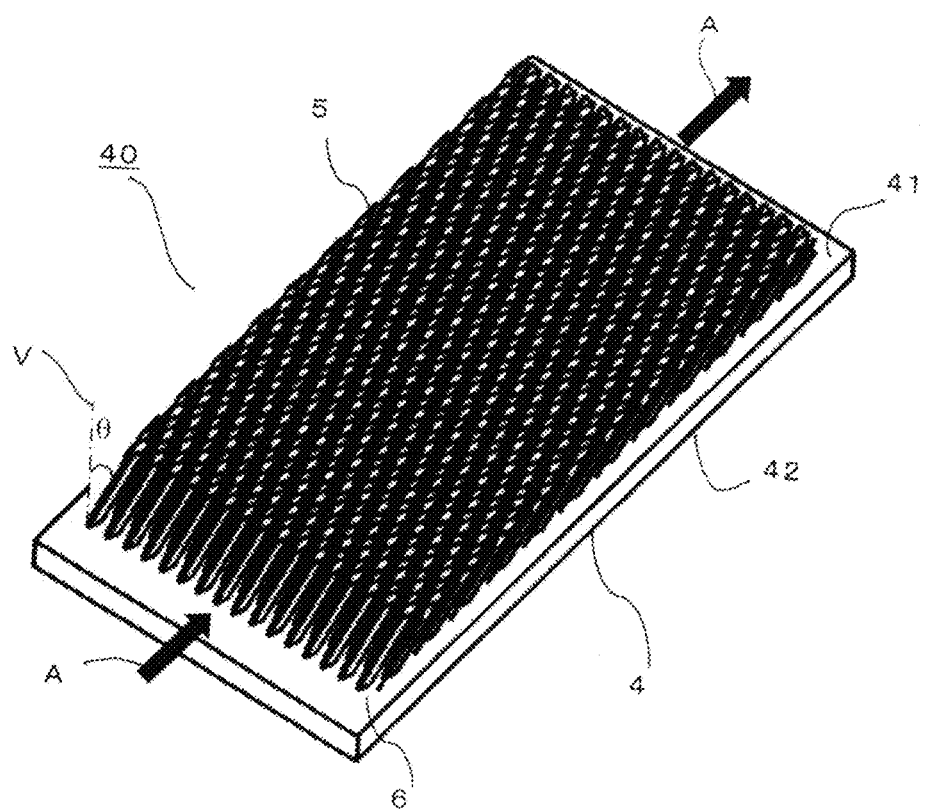
FIG. 9 is a perspective view illustrating a heat sink in a liquid-type cooling apparatus according to Embodiment 6 of the present invention.

FIG. 9 is a perspective view illustrating a heat sink in the liquid-type cooling apparatus according to Embodiment 6 of the present invention; the heat sink 40 in FIG. 1 is shown upside down so that the first surface portion 41 of the heat sink base member 4 is situated at the upper side of the drawing. As illustrated in FIG. 9, a great number of heat radiation fins 5, which are aligned lengthwise and breadthwise, are provided on the first surface portion 41 of the heat sink base member 4. At a predetermined angle θ with respect to the direction V that is perpendicular to the first surface portion 41 of the heat sink base member 4, the longitudinal direction of each of the heat radiation fins 5 is inclined toward the downstream side in the flowing direction A of the coolant. Hereinafter, the angle θ will be referred to as an inclination angle.

Figure 10:
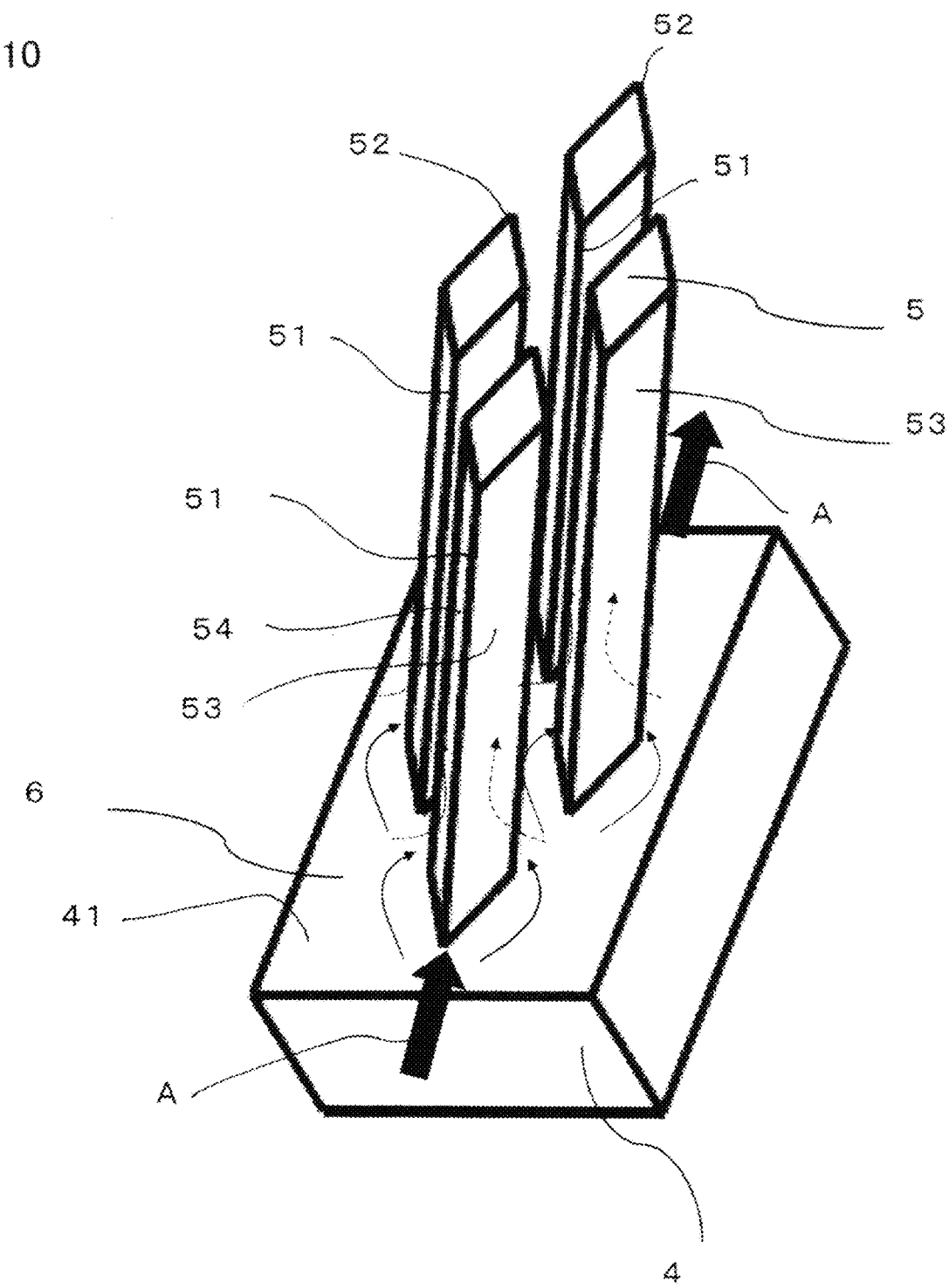
FIG. 10 is an explanatory view of the heat sink in the liquid-type cooling apparatus according to Embodiment 6 of the present invention.
Figure 11:
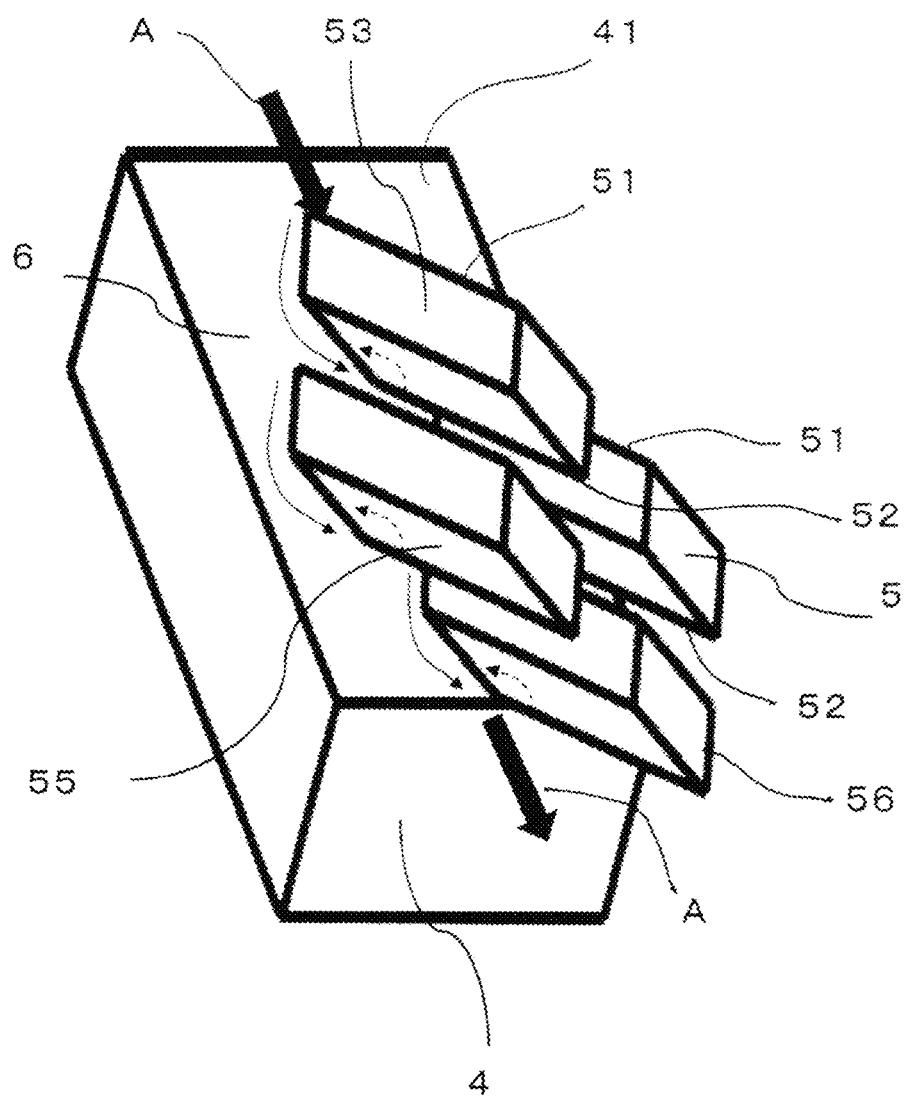
FIG. 11 is an explanatory view of the heat sink in the liquid-type cooling apparatus according to Embodiment 6 of the present invention.

Each of FIGS. 10 and 11 is an explanatory view of the heat sink in the liquid-type cooling apparatus according to Embodiment 6 of the present invention. As illustrated in FIGS. 10 and 11, each of the heat radiation fins 5 has a quadrangle-shape cross section in the direction that is perpendicular to the longitudinal direction thereof. In this embodiment, a quadrangle includes any one of a square, a rectangle, and a diamond. A first ridgeline 51 of the heat radiation fin 5 is situated at the most upstream side in the flowing direction A of the coolant, in comparison with the other portions of that heat radiation fin 5; a second ridgeline 52 that is opposite to the first ridgeline 51 is situated at the most downstream side in the flowing direction A of the coolant, in comparison with the other portions of that heat radiation fin 5.

In this situation, two or more groups of heat radiation fins that are aligned in the direction perpendicular to the flowing direction A of the coolant are each referred to as "a row group of heat radiation fins"; two or more groups of heat radiation fins that are aligned in the flowing direction A of the coolant are each referred to as "a column group of heat radiation fins". In a row group of heat radiation fins, a first gap 50a is provided between the adjacent heat radiation fins 5. In a column group of heat radiation fins, a second gap 50b is provided between the adjacent heat radiation fins 5. Whether or not the respective distances of the first gap 50a and the second gap 50b are the same is no object.

Each of the heat radiation fins 5 in a row group of heat radiation fins is disposed at a position that is away from the adjacent row group of heat radiation fins by the distance corresponding to the first gap 50a. Similarly, each of the heat radiation fins 5 in a column group of heat radiation fins is disposed at a position that is away from the adjacent column group of heat radiation fins by the distance corresponding to the second gap 50b (refer to FIG. 1).

As described above, the heat radiation fin 5 is a columnar body that is inclined toward the downstream side in the flowing direction A of the coolant, at a predetermined angle θ with respect to the direction V that is perpendicular to the first surface portion 41 of the heat sink base member 4, and in each of FIGS. 9, 10, and 11, the heat radiation fin 5 is a quadrangular prism whose cross-sectional shape is a quadrangle; however, the shape of the heat radiation fins 5 may be any one of a prism, a pyramid, and the like other than a column, an elliptic column, a cone, an elliptic cone, and a quadrangular prism.

As described above, the heat radiation fin 5 is inclined toward the downstream side in the flowing direction A of the coolant, at a predetermined inclination angle θ with respect to the direction V that is perpendicular to the first surface portion 41 of the heat sink base member 4; therefore, as illustrated in each of FIGS. 10 and 11, a first fin face 53 and a second fin face 54 that each adjoin the first ridgeline 51 situated at the upstream side in the flowing direction A of the coolant extend at an obtuse angle with respect to the first surface portion 41 of the heat sink base member 4. In contrast, a third fin face 55 and a fourth fin face 56 that each adjoin the second ridgeline 52 situated at the downstream side in the flowing direction A of the coolant extend at an acute angle with respect to the first surface portion 41 of the heat sink base member 4.

Next, the flow of the coolant around the heat radiation fin 5 will be explained. As illustrated in FIG. 10, when making contact with the first and second fin faces 53 and 54 forming side faces of the heat radiation fin 5 that crosses the first surface portion 41 of the heat sink base member 4 at an obtuse angle, the coolant changes its flowing direction not only to the direction that is parallel to the first surface portion 41 of the heat sink base member 4 (refer to arrows indicated by thin solid lines) but also to the direction that is perpendicular to the first surface portion 41 of the heat sink base member 4 in such a way as to depart from the first surface portion 41 of the heat sink base member 4 (refer to arrows indicated by thin broken lines).

Moreover, as illustrated in FIG. 11, when making contact with the third and fourth fin faces 55 and 56 forming side faces of the heat radiation fin 5 that crosses the first surface portion 41 of the heat sink base member 4 at an acute angle, the coolant changes its flowing direction not only to the direction that is parallel to the first surface portion 41 of the heat sink base member 4 (refer to arrows indicated by thin solid lines in FIG. 11) but also to the direction that is perpendicular to the first surface portion 41 of the heat sink base member 4 in such a way as to approach the first surface portion 41 of the heat sink base member 4 (refer to arrows indicated by thin wave lines in FIG. 11).

As described above, in the liquid-type cooling apparatus according Embodiment 6 of the present invention, the heat radiation fins 5 stir the coolant in the direction parallel to the first surface portion 41 of the heat sink base member 4 and in the direction perpendicular to the first surface portion 41 of the heat sink base member 4. As described above, the heat radiation fins 5 are arranged in such a way as to be aligned in the row groups of heat radiation fins and in the column groups of heat radiation fins; each of the heat radiation fins 5 in a row group of heat radiation fins is disposed at a position that is away from each corresponding heat radiation fin 5 in the adjacent row group of heat radiation fins by the distance corresponding to the first predetermined gap 50 (refer to FIG. 1).

Accordingly, because definitely colliding with the first and second fin faces 53 and 54 as side faces of the heat radiation fin 5, the coolant cannot advance straightforward in the coolant path 6; thus, the coolant is sufficiently stirred in both the directions, i.e., the direction parallel to the first surface portion 41 of the heat sink base member 4 and the direction perpendicular to the first surface portion 41 of the heat sink base member 4. Therefore, the heat radiation fins 5 need to be provided only on the heat sink base member 4 to which heat-generating devices are fixed; it is not required to provide the heat radiation fins 5 on the bottom portion 71 of the water jacket 7. Accordingly, the liquid-type cooling apparatus can be downsized.

Figure 12A:
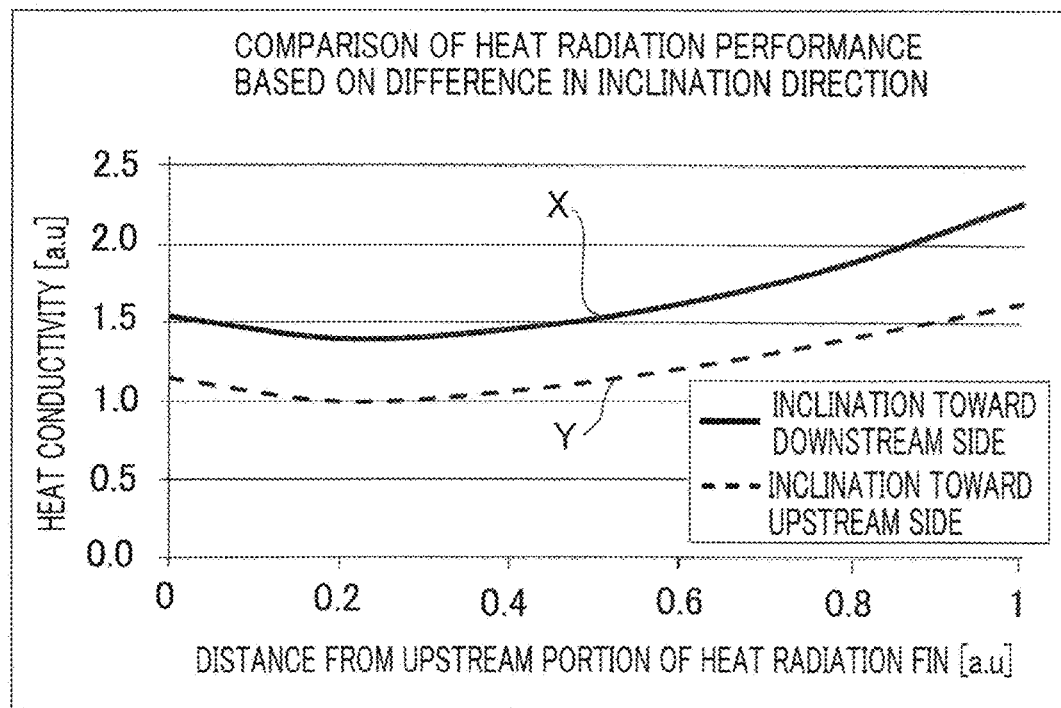
FIG. 12A is a graph for explaining the heat radiation performance of a liquid-type cooling apparatus.

FIG. 12A is a graph for explaining the heat radiation performance of the liquid-type cooling apparatus; the heat transfer rate of the heat radiation fin is calculated through a numerical simulation and then the heat radiation performances are compared in the graph, based on the difference in the inclination direction. In FIG. 12A, the ordinate denotes "the heat transfer rate" [a. u] (arbitrary unit); the abscissa denotes "the distance from the upstream point in the heat radiation fin" [a. u]. In this case, "the distance from the upstream point in the heat radiation fin" is the distance from the portion, of one heat radiation fin 5, that is situated at the most upstream side in the flowing direction A of the coolant to each of portions, of that heat radiation fin, in the longitudinal direction thereof.

Figure 12B:
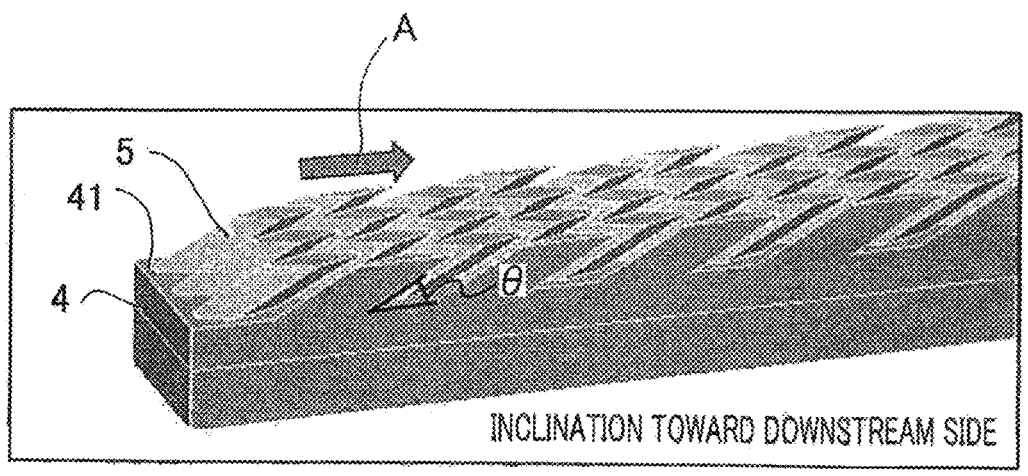
FIG. 12B is a schematic diagram for explaining heat radiation fins of the liquid-type cooling apparatus according to Embodiment 6 of the present invention.
Figure 12C:
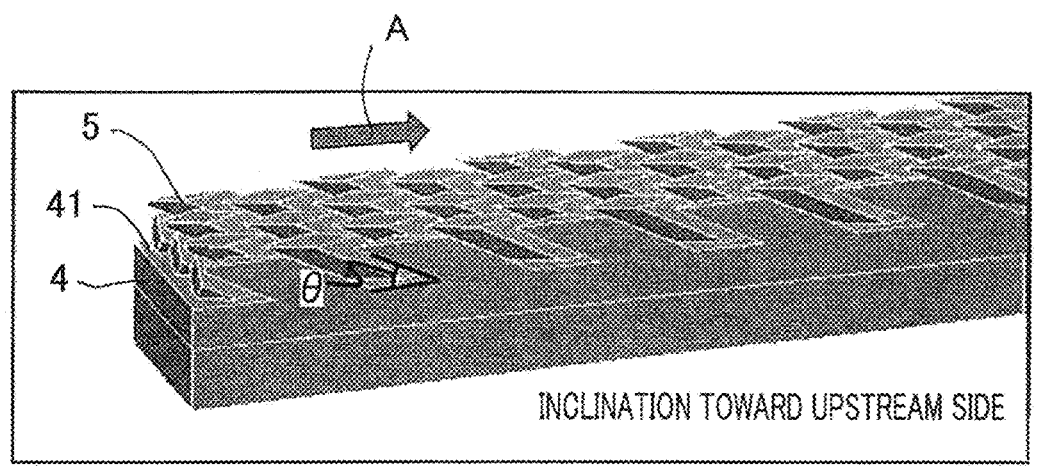
FIG. 12C is a schematic diagram for explaining heat radiation fins of a liquid-type cooling apparatus, as a comparative example for the present invention.

In other words, in the case of Embodiment 6 and in the case where as illustrated in FIG. 12B, the heat radiation fin 5 is inclined at the foregoing inclination angle θ toward the downstream side in the flowing direction A of the coolant, the portion, of the heat radiation fin 5, that is situated at the most upstream side in the flowing direction A of the coolant is the root portion, of the heat radiation fin 5, that makes contact with the first surface portion 41 of the heat sink base member 4; thus, "the distance from the upstream point in the heat radiation fin" denotes the distance from the root portion of the heat radiation fin 5 to each of portions in the longitudinal direction of the heat radiation fin 5 that extends in an inclined manner toward the downstream side in the flowing direction A of the coolant. In contrast, in the case where as illustrated in FIG. 12C, the heat radiation fin 5 is inclined at the foregoing inclination angle θ toward the upstream side in the flowing direction A of the coolant, the portion, of the heat radiation fin 5, that is situated at the most upstream side in the flowing direction A of the coolant is the front end portion that is opposite to the root portion of the heat radiation fin 5; thus, "the distance from the upstream point in the heat radiation fin" denotes the distance from the front end portion that is opposite to the root portion of the heat radiation fin 5 to each of portions in the longitudinal direction of the heat radiation fin 5.

In FIG. 12A, the solid line X represents the heat radiation characteristics of the heat radiation fins 5 at a time when as described in Embodiment 6 of the present invention and as illustrated in FIG. 12B, the heat radiation fins 5 is inclined at the inclination angle θ toward the downstream side in the flowing direction A of the coolant. The broken line Y represents the heat radiation characteristics of the heat radiation fins 5 at a time when as illustrated in FIG. 12C, the heat radiation fins 5 is inclined at the inclination angle θ toward the upstream side in the flowing direction A of the coolant. The comparison between the heat radiation characteristics X and the heat radiation characteristics Y represented in FIG. 12A suggests that regardless of the distance from the upstream side in the flowing direction A of the coolant, the heat radiation fin, described in Embodiment 1 and illustrated in FIG. 12B, that is inclined toward the downstream side in the flowing direction A of the coolant is higher in terms of the heat transfer rate of each of the portions of the heat radiation fin than the heat radiation fin that is inclined toward the upstream side in the flowing direction A of the coolant, and the heat radiation performance of the former is superior to that of the latter.

The heat radiation fins 5 in the liquid-type cooling apparatus according to Embodiment 6 of the present invention can be produced, for example, through machining, forging, die-casting, or 3-dimension printing of a high-heat-conductivity material such as aluminum, copper, ceramics, or the like.

The heat radiation fins 5 may be produced in such a way that at the initial production stage for the heat radiation fin, a heat radiation fin is formed to be perpendicular to the first surface portion of the heat sink base member and then external force is applied to the heat radiation fin that has been formed to be perpendicular to the first surface portion so that the heat radiation fin is inclined toward the downstream side in the flowing direction of the coolant.

It may be allowed that depressions and protrusions are provided in the region that is on the first surface portion 41 of the heat sink base member 4 and in which no heat radiation fins 5 exists so that the flow of the coolant is stirred and hence the heat radiation performance is raised; alternatively, it may be allowed that the inclination angle θ of the heat radiation fin 5 is changed in accordance with the location of the heat radiation fin 5 on the first surface portion 41 of the heat sink base member 4.

Embodiment 7

Next, a liquid-type cooling apparatus according to Embodiment 7 of the present invention will be explained. The liquid-type cooling apparatus according to Embodiment 7 of the present invention is characterized in that the shape of the heat radiation fin is a triangular prism, a quadrangular prism, or a hexagonal prism and in that the heat radiation fins are arranged in such a way that the respective side faces of the adjacent heat radiation fins are parallel to one another. The other configurations are the same as those in Embodiment 1 described above.

Figure 13:
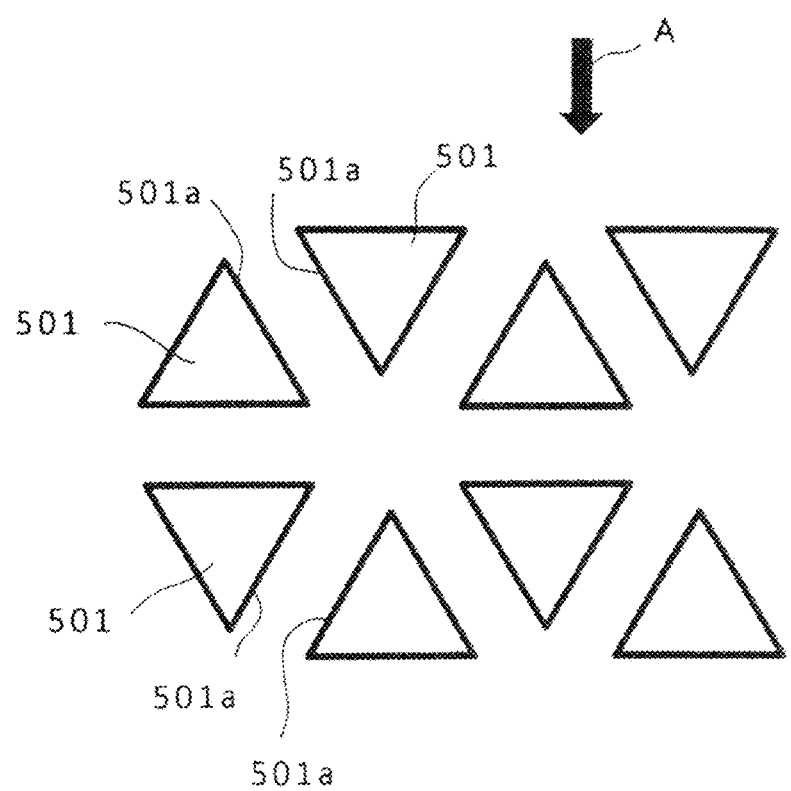
FIG. 13 is an explanatory diagram representing heat radiation fins in a liquid-type cooling apparatus according to Embodiment 7 of the present invention.

FIG. 13 is an explanatory diagram representing a heat radiation fin in the liquid-type cooling apparatus according to Embodiment 7 of the present invention. In FIG. 13, each of the heat radiation fins 501 provided on the first surface portion 41 of the heat sink base member 4 (refer to FIGS. 1 through 4) is formed of a triangular prism whose cross section perpendicular to the longitudinal direction thereof is triangular; the heat radiation fins 501 are arranged in such a way that the respective fin faces 501a, of the adjacent heat radiation fins 501, that face one another are parallel to one another. The coolant flows in the direction of the arrow A. Each of the heat radiation fins 501 is inclined at an inclination angle θ with respect to the flowing direction A of the coolant. The other configurations are the same as those in Embodiment 6 described above.

Figure 14:
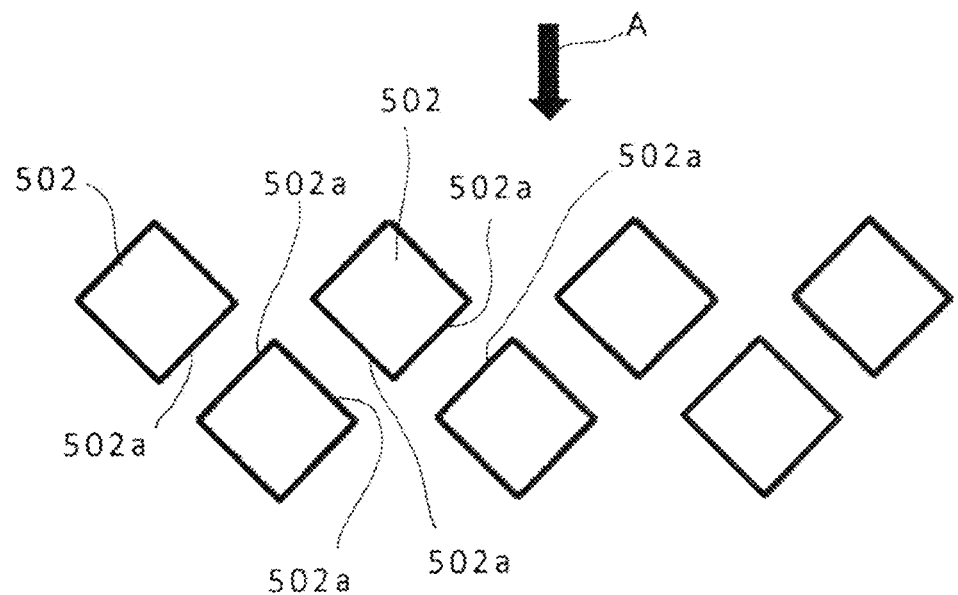
FIG. 14 is an explanatory diagram representing a variant example of heat radiation fin in the liquid-type cooling apparatus according to Embodiment 7 of the present invention.

FIG. 14 is an explanatory diagram representing a variant example of heat radiation fin in the liquid-type cooling apparatus according to Embodiment 7 of the present invention. In FIG. 14, each of the heat radiation fins 502 provided on the first surface portion 41 of the heat sink base member 4 (refer to FIG. 1 and FIGS. 9 through 11) is formed of a quadrangular prism whose cross section perpendicular to the longitudinal direction thereof is quadrangular; the heat radiation fins 502 are arranged in such a way that the respective fin faces 502a, of the adjacent heat radiation fins 502, that face one another are parallel to one another. The coolant flows in the direction of the arrow A. Each of the heat radiation fins 502 is inclined at an inclination angle θ with respect to the flowing direction A of the coolant. The other configurations are the same as those in Embodiment 6 described above.

Figure 15:
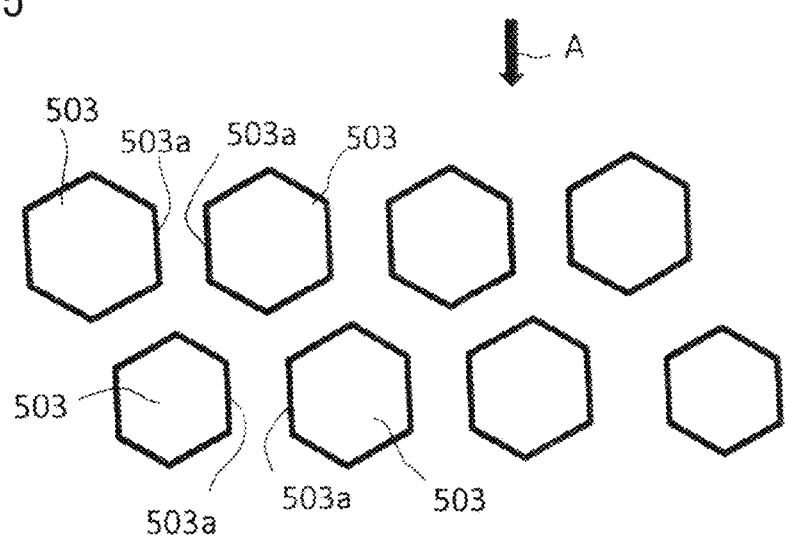
FIG. 15 is an explanatory diagram representing another variant example of heat radiation fin in the liquid-type cooling apparatus according to Embodiment 7 of the present invention.

FIG. 15 is an explanatory diagram representing another variant example of heat radiation fin in the liquid-type cooling apparatus according to Embodiment 7 of the present invention. In FIG. 15, each of the heat radiation fins 503 provided on the first surface portion 41 of the heat sink base member 4 (refer to FIG. 1 and FIGS. 9 through 11) is formed of a hexagonal prism whose cross section perpendicular to the longitudinal direction thereof is hexagonal; the heat radiation fins 503 are arranged in such a way that the respective fin faces 503a, of the adjacent heat radiation fins 503, that face one another are parallel to one another. The coolant flows in the direction of the arrow A. Each of the heat radiation fins 503 is inclined at an inclination angle θ with respect to the flowing direction A of the coolant. The other configurations are the same as those in Embodiment 6 described above.

As is the case with Embodiment 6, in the liquid-type cooling apparatus, represented in FIGS. 13, 14, and 15, according to Embodiment 7, when making contact with the fin faces that cross the first surface portion 41 of the heat sink base member 4 at an obtuse angle, the coolant changes its flowing direction not only to the direction that is parallel to the first surface portion 41 of the heat sink base member 4 but also to the direction that is perpendicular to the first surface portion 41 of the heat sink base member 4 in such a way as to depart from the first surface portion 41 of the heat sink base member 4. Moreover, when making contact with the fin faces, of each of the heat radiation fins 501, 502, and 503, that cross the first surface portion 41 of the heat sink base member 4 at an acute angle, the coolant changes its flowing direction not only to the direction that is parallel to the first surface portion 41 of the heat sink base member 4 but also to the direction that is perpendicular to the first surface portion 41 of the heat sink base member 4 in such a way as to approach the first surface portion 41 of the heat sink base member 4.

Accordingly, the coolant is sufficiently stirred in the direction parallel to the first surface portion 41 of the heat sink base member 4 and in the direction perpendicular thereto. Therefore, each of the heat radiation fins 501, 502, and 503 needs to be provided only on the heat sink base member 4 to which heat-generating devices are fixed; it is not required to provide the heat radiation fins on the bottom portion 71 of the water jacket 7. Accordingly, the liquid-type cooling apparatus can be downsized.

When as described above, the shape of the heat radiation fin is a triangular prism, a quadrangular prism, or a hexagonal prism, adjustment of the dimensions makes it possible to arrange the heat radiation fins in such a way the all respective side faces of the adjacent heat radiation fins are parallel to one another. The fact that the respective side faces of the adjacent heat radiation fins are parallel to each other suggests that the gap between the adjacent heat radiation fins is held to a fixed distance, i.e., that the flow rate of the coolant that flows between the adjacent heat radiation fins is held to a fixed value. For example, in the case where the minimum size of the gap between the adjacent heat radiation fins is specified, all of the respective sizes of the gaps between the adjacent heat radiation fins are set to the minimum gap size, so that the flow rate of the coolant that flows between the adjacent heat radiation fins can be made maximum in the size restriction. Because the heat radiation capability of the heat radiation fin is proportional to the flow rate of the coolant, the cooling performance of the liquid-type cooling apparatus according to Embodiment 7 of the present invention is raised.

Embodiment 8

Next, there will be explained a manufacturing method for the heat radiation fin of a liquid-type cooling apparatus, according to Embodiment 8 of the present invention. The manufacturing method for the heat radiation fins in the liquid-type cooling apparatus, according to Embodiment 8, is characterized in that heat radiation fins are manufactured by use of a cutting tool having a plurality of circular blades whose diameters are different from one another; the manufacturing method is a manufacturing method for heat radiation fins in a liquid-type cooling apparatus at a time when as each of the liquid-type cooling apparatuses according to before-mentioned Embodiments 1 and 2, the heat radiation fins are inclined on the whole from the first surface portion of the heat sink base member toward the downstream side in the flowing direction of the coolant.

Figure 16:
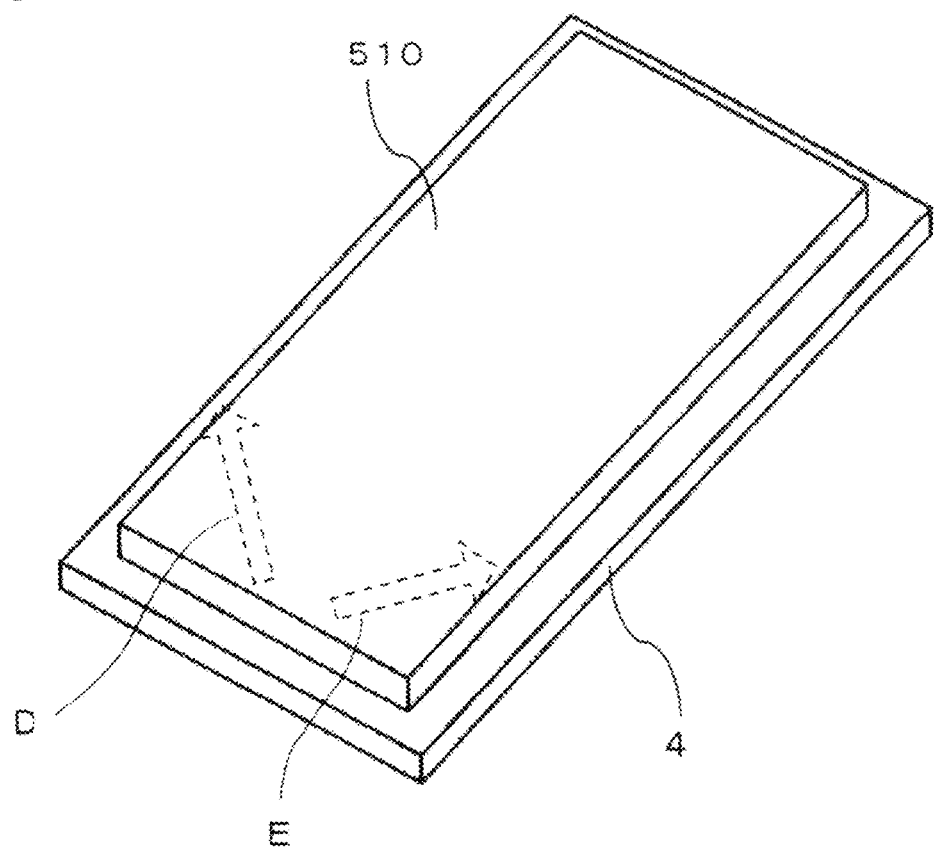
FIG. 16 is an explanatory view illustrating a manufacturing method for heat radiation fins of a liquid-type cooling apparatus according to Embodiment 8 of the present invention.
Figure 17:
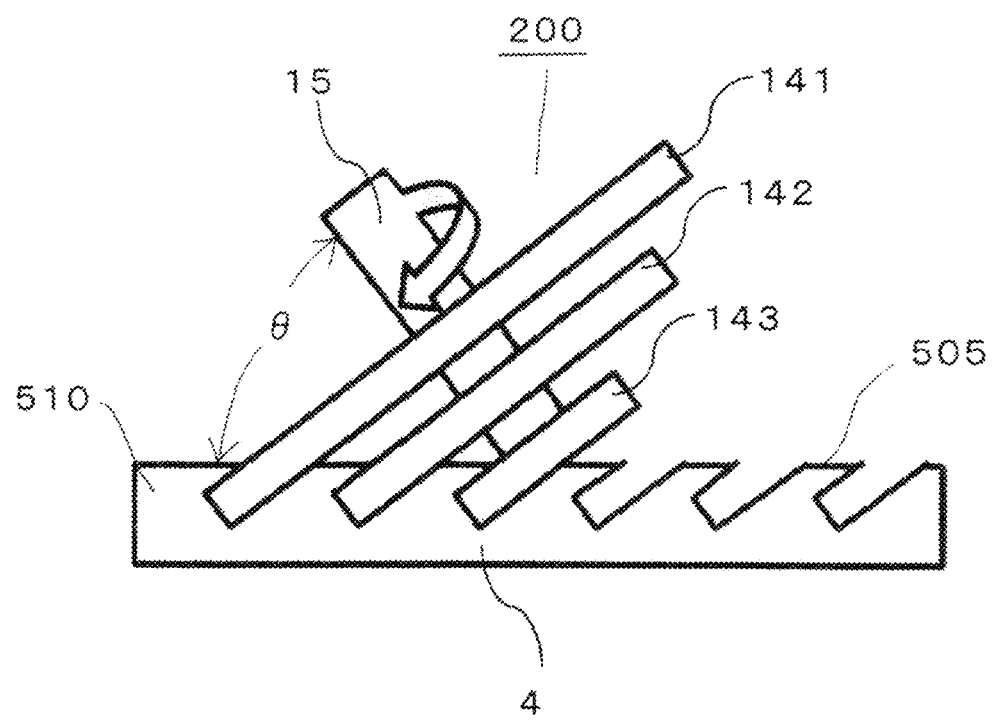
FIG. 17 is an explanatory view illustrating a manufacturing method for the heat radiation fins of the liquid-type cooling apparatus according to Embodiment 8 of the present invention.

Each of FIGS. 16 and 17 is an explanatory view illustrating a manufacturing method for the heat radiation fin of the liquid-type cooling apparatus according to Embodiment 8 of the present invention. At first, as illustrated in FIG. 16, through an extrusion method or the like, a plate-shaped heat radiation fin region 510 having predetermined thickness dimension, longitudinal width dimension, and transverse width dimension is formed on the heat sink base member 4 made of a high-heat conductivity material such as aluminum, copper, or ceramics. It may be allowed that the board thickness of the heat sink base member 4 is set to a value preliminarily including the thickness of the heat radiation fin region 510 and that the plate-shaped heat radiation fin region 510 having predetermined thickness dimension, longitudinal width dimension, and transverse width dimension is formed.

Next, by use of a cutting tool 200, illustrated in FIG. 17, in which a plurality of circular blades 141, 142, and 143 whose diameters are different from one another are arranged on an axle 15 in such a way as to be evenly spaced a predetermined distance away from one another, the heat radiation fin region 510 is cut at a predetermined inclination angle in any one of the directions indicated by the arrows D and E in FIG. 16 so that there are formed inclined grooves that are spaced a predetermined distance away from one another. Next, by use of the cutting tool 200, the heat radiation fin region 510 is cut at a predetermined inclination angle in the other one of the directions indicated by the arrows D and E so that there are formed inclined grooves that are spaced a predetermined distance away from one another. Inclined grooves are formed in the heat radiation fin region 510 in both directions D and E in such a manner as described above, so that heat radiation fins 505 illustrated in FIG. 17 are formed.

The cutting tool 200 is formed in such a way that as illustrated in FIG. 17, the plurality of circular blades 141, 142, and 143 whose diameters are different from one another are fixed on an axle 15 to be evenly spaced a predetermined distance away from one another; a plurality of inclined grooves are concurrently formed in the heat radiation fin region 510 by rotating the axle 15 inclined at an inclination angle θ with respect to the plane of the heat radiation fin region 510, so that a great number of heat radiation fins 505 that are inclined at the inclination angle θ can readily be manufactured.

Embodiment 9

The manufacturing method for heat radiation fins in a liquid-type cooling apparatus, according to foregoing Embodiment 8, relates to a manufacturing method for heat radiation fins in a liquid-type cooling apparatus at a time when the heat radiation fins are inclined on the whole from the first surface portion of the heat sink base member toward the downstream side in the flowing direction of the coolant; the manufacturing method is characterized in that the heat radiation fins are manufactured by use of a cutting tool having a plurality of circular blades whose diameters are different from one another. However, when the number of circular blades are large, a circular blade whose diameter is excessively large and a circular blade whose diameter is excessively small are required. When the working efficiency is taken into consideration, neither a circular blade whose diameter is excessively large nor a circular blade whose diameter is excessively small can be utilized; thus, from a practical standpoint, the number of circular blades whose diameters are different from one another is limited and hence the number of grooves that can be processed at one time is limited.

A manufacturing method for a liquid-type cooling apparatus and heat radiation fins in the liquid-type cooling apparatus, according to Embodiment 9 of the present invention, is to solve the foregoing problems in the manufacturing method for heat radiation fins, according to Embodiment 8; there is provided a manufacturing method for a liquid-type cooling apparatus having heat radiation fins that can efficiently be manufactured by use of a cutting tool including a plurality of circular blades whose diameters are equal to one another and for the heat radiation fins in the liquid-type cooling apparatus.

Firstly, a liquid-type cooling apparatus according to Embodiment 9 of the present invention will be explained. The liquid-type cooling apparatus according to Embodiment 9 of the present invention is characterized in that the heat radiation fin is configured with an inclination portion that makes contact with the first surface portion of the heat sink base member and an erect portion that extends from the inclination portion in a vertical manner with respect to the first surface portion of the heat sink base member. The other configurations are the same as those in each of Embodiments 1 and 2, described above.

Figure 18:
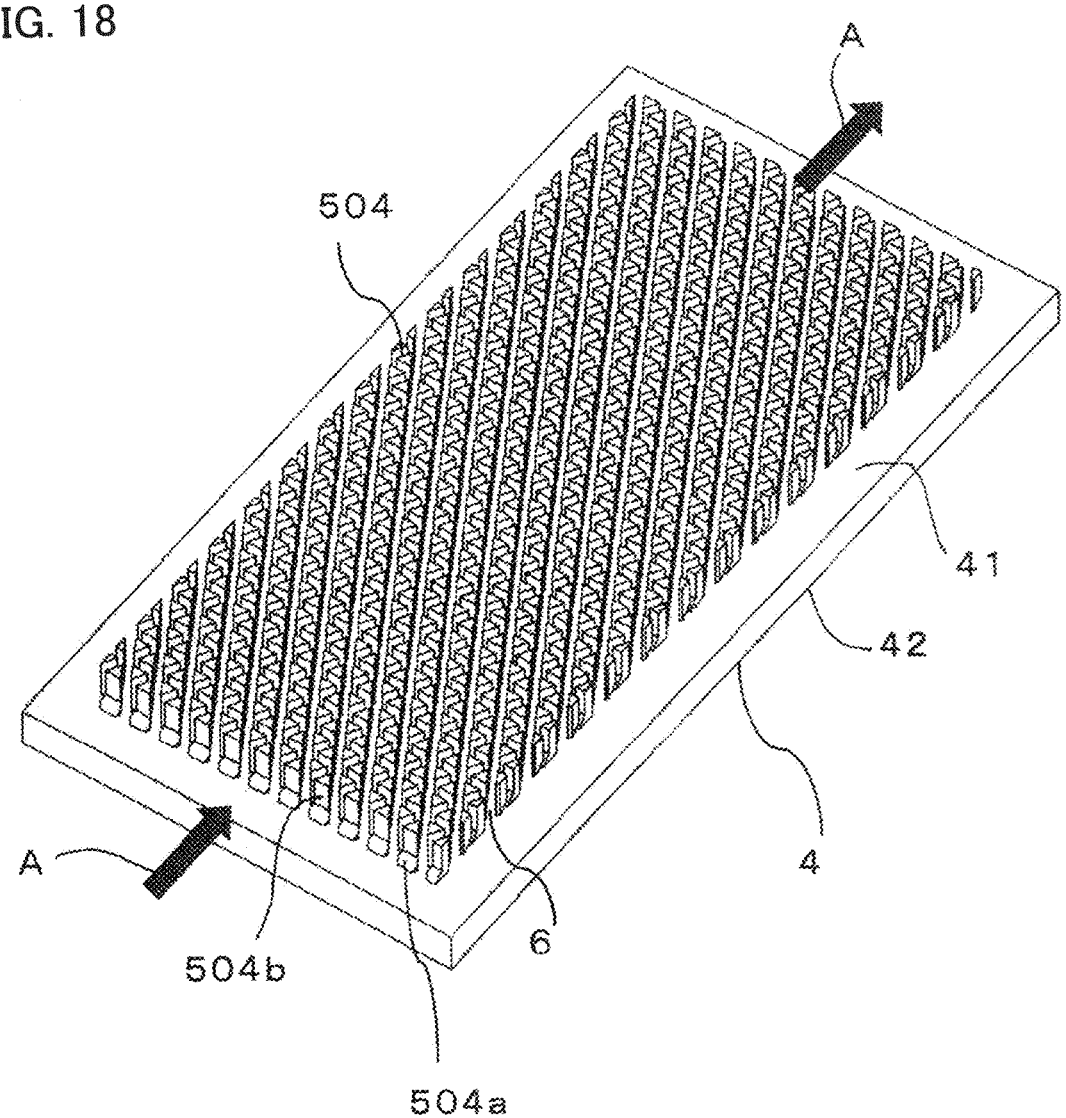
FIG. 18 is a perspective view illustrating a heat sink of a liquid-type cooling apparatus according to Embodiment 9 of the present invention.
Figure 19:
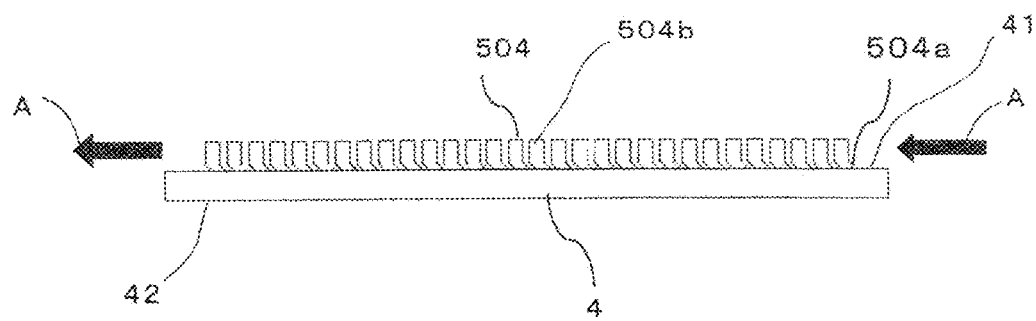
FIG. 19 is a side view illustrating the heat sink of the liquid-type cooling apparatus according to Embodiment 9 of the present invention.

FIG. 18 is a perspective view illustrating a heat sink of the liquid-type cooling apparatus according to Embodiment 9 of the present invention; FIG. 19 is a side view illustrating the heat sink of the liquid-type cooling apparatus according to Embodiment 9 of the present invention. In FIGS. 18 and 19, as is the case with Embodiment 1, the respective heat radiation fins 504 provided on the first surface portion 41 of the heat sink base member 4 are aligned in a column group of heat radiation fins as well as in a row group of heat radiation fins. Each of the heat radiation fins 504 is formed of a triangular prism, as illustrated in FIG. 6, in foregoing Embodiment 2. It goes without saying that the shape thereof may be other than a triangular prism.

As well illustrated in FIG. 19, each of the heat radiation fins 504 is configured with an inclination portion 504a that is formed in a portion that makes contact with the first surface portion 41 of the heat sink base member 4, i.e., in the root portion of the heat radiation fin 504 and an erect portion 504b that extends from the inclination portion 504a in a vertical manner with respect to the first surface portion 41 of the heat sink base member 4. The inclination portion 504a of the heat radiation fin 504 is inclined at the inclination angle θ toward the downstream side in the flowing direction A of the coolant. The erect portion 504b of the heat radiation fin is configured with portions other than the inclination portion 504a.

Because with regard to the temperature distribution of a coolant, the temperature of the portion close to the heat sink base member 4, especially, is liable to become high, the inclination portion 504a is provided in the root portion of the heat radiation fin 504 and hence the coolant flowing in the vicinity of the first surface portion 41 of the heat sink base member 4 is autonomously stirred, so that the cooling performance of the liquid-type cooling apparatus is raised.

Next, there will be explained a manufacturing method for the heat radiation fin of the liquid-type cooling apparatus, according to Embodiment 9 of the present invention. The manufacturing method for heat radiation fins, according to Embodiment 9 of the present invention, is a method of manufacturing the heat radiation fins of the liquid-type cooling apparatus illustrated in each of FIGS. 18 and 19, described above; the manufacturing method is characterized in that after a plurality of comb-like protruding threads that each include an inclination portion are formed through extrusion method or the like, cutting processing is applied to the protruding threads in a vertical manner with respect to the surface portion of the heat sink base member, by use of a plurality of circular blades whose diameters are one and the same, so that heat radiation fins are manufactured.

In the case where when the comb-like protruding thread formed through the extrusion method or the like has only the inclination portion, cutting processing is applied to the protrusion in a vertical manner with respect to the surface portion of the heat sink base member by use of a circular blade, lots of portions of the protruding thread are cut off and hence only the root portion remains; however, because in Embodiment 9 of the present invention, the protruding thread is configured with an inclined protruding thread portion formed in the root portion that is connected with the surface portion of the heat sink base member and an erect protruding thread portion that extends from the inclined protrusion portion in a vertical manner with respect to the surface portion of the heat sink base member, a heat radiation fin having the inclined protruding thread portion in the root portion and the erect protruding thread portion is formed even when cutting processing utilizing circular blades is performed in the vertical direction with respect to the surface portion of the heat sink base member.

Figure 20:
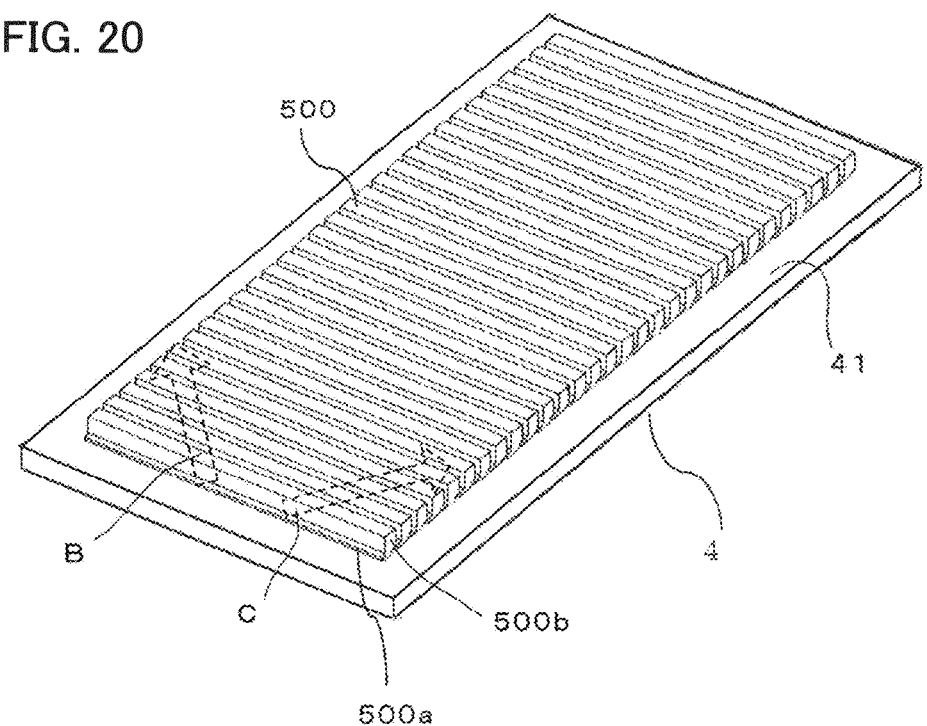
FIG. 20 is a perspective view for explaining a manufacturing method for heat radiation fins of the liquid-type cooling apparatus according to Embodiment 9 of the present invention.

FIG. 20 is a perspective view for explaining a manufacturing method for the heat radiation fins of the liquid-type cooling apparatus according to Embodiment 9 of the present invention. At first, as illustrated in FIG. 20, through an extrusion method or the like, protruding threads 500 that each continuously extend in the row direction are formed in such a way as to be aligned in the column direction, spaced a predetermined distance away from one another, on the first surface portion 41 of the heat sink base member 4 made of a high-heat conductivity material such as aluminum, copper, or ceramics. As illustrated also in FIG. 19, the protruding thread 500 that continues in the row direction is configured with an inclined protruding thread portion 500a that is formed in a portion that makes contact with the first surface portion 41 of the heat sink base member 4, in such a way as to be inclined at the inclination angle θ, and an erect protruding thread portion 500b that extends from the inclined protruding thread portion 500a in a vertical manner with respect to the first surface portion 41 of the heat sink base member 4.

Next, as illustrated in FIG. 20, by use of a cutting tool in which a plurality of circular blades whose diameters are equal to one another are arranged in such a way as to be evenly spaced from one another in the axle direction, the protruding threads 500 formed in the shape of a comb are cut at even intervals in any one of the directions indicated by arrows B and C so that a plurality of grooves having a predetermined width are formed. Next, the protruding threads 500 are cut at even intervals in the other one of the directions indicated by arrows B and C so that a plurality of grooves having a predetermined width are formed. In this situation, the plurality of circular blades having the same diameter cut the erect protruding thread portions 500b of the protruding threads 500 in a vertical manner with respect to the first surface portion 41 of the heat sink base member 4. The cutting processing makes it possible to manufacture the heat sink 40 in which the respective heat radiation fins 504b illustrated in FIG. 18 are formed.

In the manufacturing method for the heat radiation fins in the liquid-type cooling apparatus according to Embodiment 9 of the present invention, the number of circular blades is not limited, unlike Embodiment 8; thus, an increase in the number of circular blades makes it possible to manufacture the heat radiation fins in a considerably efficient and easy manner.

In the scope of the present invention, the embodiments thereof can appropriately be modified or omitted.

INDUSTRIAL APPLICABILITY

The present invention can be applied not only to the field of a liquid-type cooling apparatus for cooling heat-generating devices such as semiconductor devices but also to the field in which the liquid-type cooling apparatus is utilized, for example, the field of the automobile industry.

DESCRIPTION OF REFERENCE NUMERALS

100: liquid-type cooling apparatus
1: first heat-generating device
2: second heat-generating device
3: third heat-generating device
40: heat sink 4: heat sink base member
41: first surface portion
42: second surface portion
500: protruding thread
500a: inclined protruding thread portion
500b: erect protruding thread portion
5, 501, 502, 503, 504, 505: heat radiation fin
501a, 502a, 503a: fin face
504a: inclination portion
504b: erect portion
50a: first gap
50b: second gap
51: first ridgeline
52: second ridgeline
53: first fin face
54: second fin face
55: third fin face
56: fourth fin face
6: coolant path
7: water jacket
71: bottom portion
72: circumferential wall portion
721, 722: short-side portion
723, 724: long-side portion
8: coolant inlet pipe
9: coolant outlet pipe
510: heat radiation fin region
200: cutting tool
141, 142, 143: circular blade

The invention claimed is:

1. A liquid-type cooling apparatus in which there are provided a jacket including a coolant path through which a coolant flows and a heat sink that directly or indirectly makes contact with at least one heat-generating device and makes contact with the coolant flowing in the jacket and in which heat generated by the heat-generating device is transferred to the coolant through the intermediary of the heat sink so that the heat is radiated, wherein in the heat sink, the thermal resistance from a portion where the heat sink directly or indirectly makes contact with the heat-generating device to a portion where the heat sink makes contact with the coolant is set to be a value that is different from the thermal resistance at a different position in the flowing direction of the coolant,
wherein a width of the coolant path in a direction perpendicular to the flowing direction of the coolant and parallel to a plane of the jacket gradually decreases toward the downstream side of the coolant flowing in the jacket from an upstream end of the jacket to a downstream end of the jacket in the flowing direction of the coolant, and
wherein the heat sink comprises a plurality of first rows of heat radiation fins provided alternating with a plurality of second rows of heat radiation fins, the plurality of second rows being offset from the plurality of first rows in a direction perpendicular to the flowing direction of the coolant, and a distance between center lines of adjacent ones of the first and second rows gradually decreasing toward the downstream end of the jacket.

2. The liquid-type cooling apparatus according to claim 1, wherein the value of the thermal resistance of the heat sink is set in such a way as to decrease toward the downstream side of the coolant flowing in the jacket.

3. The liquid-type cooling apparatus according to claim 2, wherein the value of the thermal resistance of the heat sink is reduced by decreasing the cross-sectional area of the coolant path in the direction perpendicular to the flowing direction of the coolant.

4. The liquid-type cooling apparatus according to claim 3, wherein the heat sink has a plurality of heat radiation fins that each make contact with the coolant, and
wherein the cross-sectional area of the coolant path is reduced by increasing the lengths of the plurality of heat radiation fins in the direction perpendicular to the flowing direction of the coolant.

5. The liquid-type cooling apparatus according to claim 3, wherein the heat sink has a plurality of heat radiation fins that each make contact with the coolant, and
wherein the cross-sectional area of the coolant path is reduced by increasing the number of the heat radiation fins arranged in the unit area of the coolant path.

6. The liquid-type cooling apparatus according to claim 3, wherein the heat sink has a plurality of heat radiation fins that each make contact with the coolant, and
wherein the cross-sectional area of the coolant path is reduced by increasing the volume of each of the heat radiation fins.

7. The liquid-type cooling apparatus according to claim 1, wherein a plurality of the heat-generating devices are provided,
wherein the heat sink directly or indirectly makes contact with the respective heat-generating devices at different positions in the flowing direction of the coolant, and
wherein the thermal resistances at the different positions of the heat sink are set to respective different values in accordance with cooling priorities of the plurality of heat-generating devices.

8. A liquid-type cooling apparatus in which there are provided a jacket through which a coolant flows and a heat sink that makes contact with the coolant flowing in the jacket and in which heat generated by a heat-generating device is transferred to the coolant through the intermediary of the heat sink so that the heat is radiated,
wherein the heat sink includes a heat sink base member having a first surface portion that faces the inside of the jacket and a plurality of heat radiation fins that are provided on the first surface portion of the heat sink base member and make contact with the coolant flowing in the jacket, the plurality of heat radiation fins being arranged in a direction of coolant flow and in a direction perpendicular to the direction of coolant flow and parallel to a plane of the jacket,
wherein the plurality of heat radiation fins are inclined toward the downstream side of the coolant flowing in the jacket such that each heat radiation fin from among the plurality of heat radiation fins is positioned farther downstream with increasing distance from the heat sink base member, and
wherein each heat radiation fin from among the plurality of heat radiation fins comprises an inclination portion that leans toward the downstream side of the coolant flowing in the jacket and an erect portion extending perpendicular to the first surface portion of the heat sink base member.

9. The liquid-type cooling apparatus according to claim 8, wherein the heat radiation fin is formed of a triangular prism, a quadrangular prism, or a hexagonal prism, and
wherein a side face of the heat radiation fin is parallel to the corresponding side face of another heat radiation fin that is adjacent to said heat radiation fin.

10. The liquid-type cooling apparatus according to claim 8, wherein the heat radiation fin includes an inclination portion that makes contact with the first surface portion of the heat sink base member and is inclined toward the downstream side of the coolant flowing in the jacket and an erect portion that stands erect from the inclination portion with respect to the first surface portion.

11. The liquid-type cooling apparatus according to claim 9, wherein the heat radiation fin includes an inclination portion that makes contact with the first surface portion of the heat sink base member and is inclined toward the downstream side of the coolant flowing in the jacket and an erect portion that stands erect from the inclination portion with respect to the first surface portion.

12. A manufacturing method for heat radiation fins in the liquid-type cooling apparatus according to claim 8,
    wherein on the first surface portion of the heat sink base member, a plate-shaped heat radiation fin region protruding by a predetermined dimension from the first surface portion is formed, and
    wherein a plurality of circular blades that are arranged in such a way as to be spaced a predetermined distance away from one another and whose diameters are different from one another are rotated and then the plurality of circular blades concurrently cut the heat radiation fin region at an inclination angle with respect to the first surface portion so that the plurality of heat radiation fins are formed.

13. A manufacturing method for heat radiation fins in the liquid-type cooling apparatus according to claim 9,
    wherein on the first surface portion of the heat sink base member, a plate-shaped heat radiation fin region protruding by a predetermined dimension from the first surface portion is formed, and
    wherein a plurality of circular blades that are arranged in such a way as to be spaced a predetermined distance away from one another and whose diameters are different from one another are rotated and then the plurality of circular blades concurrently cut the heat radiation fin region at an inclination angle with respect to the first surface portion so that the plurality of heat radiation fins are formed.

14. A manufacturing method for heat radiation fins in the liquid-type cooling apparatus according to claim 10,
    wherein on the first surface portion of the heat sink base member, there are formed a plurality of protruding threads that are arranged in parallel with one another and that each protrude by a predetermined dimension from the first surface portion,
    wherein each of the plurality of protruding threads includes an inclined protruding thread portion that is provided in such a way as to make contact with the first surface portion and is inclined toward a predetermined direction with respect to the first surface portion and an erect protruding thread portion that is provided in such a way as to make contact with the inclined protruding thread portion and stands erect with respect to the first surface portion, and
    wherein the plurality of heat radiation fins are formed through cutting processing of the plurality of protruding threads.

15. A manufacturing method for heat radiation fins in the liquid-type cooling apparatus according to claim 11,
    wherein on the first surface portion of the heat sink base member, there are formed a plurality of protruding threads that are arranged in parallel with one another and that each protrude by a predetermined dimension from the first surface portion,
    wherein each of the plurality of protruding threads includes an inclined protruding thread portion that is provided in such a way as to make contact with the first surface portion and is inclined toward a predetermined direction with respect to the first surface portion and an erect protruding thread portion that is provided in such a way as to make contact with the inclined protruding thread portion and stands erect with respect to the first surface portion, and
    wherein the plurality of heat radiation fins are formed through cutting processing of the plurality of protruding threads.

* * * * *